(12) United States Patent
Hui et al.

(10) Patent No.: US 11,606,646 B2
(45) Date of Patent: *Mar. 14, 2023

(54) METHOD OF MAKING A PIEZOELECTRIC MEMS DIAPHRAGM MICROPHONE

(71) Applicant: Skyworks Solutions, Inc., Irvine, CA (US)

(72) Inventors: Yu Hui, Irvine, CA (US); Kwang Jae Shin, Yongin (KR)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/138,320

(22) Filed: Dec. 30, 2020

(65) Prior Publication Data

US 2021/0120345 A1 Apr. 22, 2021

Related U.S. Application Data

(63) Continuation of application No. 16/890,858, filed on Jun. 2, 2020.

(60) Provisional application No. 62/857,701, filed on Jun. 5, 2019, provisional application No. 62/857,675, filed on Jun. 5, 2019.

(51) Int. Cl.
*H04R 17/00* (2006.01)
*H04R 17/02* (2006.01)
(Continued)

(52) U.S. Cl.
CPC .......... *H04R 17/02* (2013.01); *B81B 3/0072* (2013.01); *H04R 1/04* (2013.01); *H04R 7/10* (2013.01);
(Continued)

(58) Field of Classification Search
CPC . H04R 17/02; H04R 1/04; H04R 7/10; H04R 19/04; H04R 2420/07;
(Continued)

(56) References Cited

U.S. PATENT DOCUMENTS 6,657,517 B2 12/2003 Barber et al.
6,857,501 B1 2/2005 Han
(Continued)

FOREIGN PATENT DOCUMENTS

CN 109495829 3/2019
CN 110545514 12/2019
(Continued)

*Primary Examiner* — Matthew A Eason
(74) *Attorney, Agent, or Firm* — Knobbe, Martens, Olson & Bear, LLP

(57) ABSTRACT

A piezoelectric microelectromechanical systems diaphragm microphone can be mounted on a printed circuit board. The microphone can include a substrate with an opening between a bottom end of the substrate and a top end of the substrate. The microphone can have two or more piezoelectric film layers disposed over the top end of the substrate and defining a diaphragm structure. Each of the two or more piezoelectric film layers can have a predefined residual stress that substantially cancel each other out so that the diaphragm structure is substantially flat with substantially zero residual stress. The microphone can include one or more electrodes disposed over the diaphragm structure. The diaphragm structure is configured to deflect when the diaphragm is subjected to sound pressure via the opening in the substrate.

20 Claims, 18 Drawing Sheets

(51) Int. Cl.
  *B81B 3/00* (2006.01)
  *H04R 1/04* (2006.01)
  *H04R 7/10* (2006.01)
  *H04R 19/04* (2006.01)

(52) U.S. Cl.
  CPC ...... *H04R 19/04* (2013.01); *B81B 2201/0257* (2013.01); *B81B 2203/019* (2013.01); *B81B 2203/0127* (2013.01); *B81B 2203/04* (2013.01); *H04R 2201/003* (2013.01); *H04R 2420/07* (2013.01); *H04R 2499/11* (2013.01)

(58) Field of Classification Search
  CPC .......... H04R 2201/003; H04R 2499/11; H04R 2430/20; B81B 3/0072; B81B 2203/0127; B81B 2203/019; B81B 2203/04; B81B 2201/0257; B81C 2201/0167
  See application file for complete search history.

(56) References Cited

U.S. PATENT DOCUMENTS

| | | | |
|---|---|---|---|
| 8,466,606 B2 | 6/2013 | Chen | |
| 8,531,088 B2 | 9/2013 | Grosh | |
| 8,582,788 B2 | 11/2013 | Leidl et al. | |
| 9,029,963 B2 | 5/2015 | Sparks et al. | |
| 9,055,372 B2 | 6/2015 | Grosh | |
| 9,386,379 B2 | 7/2016 | Sparks | |
| 9,479,875 B2 | 10/2016 | Hall | |
| 9,516,421 B1 | 12/2016 | Loeppert | |
| 9,853,201 B2 | 12/2017 | Grosh et al. | |
| 10,001,391 B1 | 6/2018 | Littrell | |
| 10,170,685 B2 | 1/2019 | Grosh et al. | |
| 10,356,531 B2 | 7/2019 | Giusti et al. | |
| 10,825,982 B1 | 11/2020 | Littrell et al. | |
| 11,099,078 B1 | 8/2021 | Littrell et al. | |
| 2009/0116662 A1 | 5/2009 | Wu | |
| 2015/0255308 A1 | 9/2015 | Lin et al. | |
| 2015/0266717 A1* | 9/2015 | Okamoto | B81B 3/0091 257/418 |
| 2016/0258824 A1* | 9/2016 | Fuji | G01B 7/24 |
| 2018/0138391 A1 | 5/2018 | Grosh et al. | |
| 2019/0177155 A1* | 6/2019 | Qian | B81C 1/00666 |
| 2020/0148532 A1 | 5/2020 | Grosh et al. | |

FOREIGN PATENT DOCUMENTS

| | | |
|---|---|---|
| JP | 2018 137297 | 8/2018 |
| WO | WO 2017/200219 | 11/2017 |

\* cited by examiner

METHOD OF MAKING A PIEZOELECTRIC MEMS DIAPHRAGM MICROPHONE

INCORPORATION BY REFERENCE TO ANY PRIORITY APPLICATIONS

Any and all applications for which a foreign or domestic priority claim is identified in the Application Data Sheet as filed with the present application, including U.S. patent application Ser. No. 16/890,858, filed Jun. 2, 2020 and titled "PIEZOELECTRIC MEMS DIAPHRAGM MICROPHONE", U.S. Provisional Patent Application No. 62/857,675, filed Jun. 5, 2019 and titled "PIEZOELECTRIC MEMS DIAPHRAGM MICROPHONE," and U.S. Provisional Patent Application No. 62/857,701, filed Jun. 5, 2019 and titled "METHOD OF MAKING A PIEZOELECTRIC MEMS DIAPHRAGM MICROPHONE," are hereby incorporated by reference under 37 CFR 1.57.

BACKGROUND

Field

The present disclosure is directed to a piezoelectric microelectromechanical systems (MEMS) microphone, and in particular to a multi-layer piezoelectric MEMS diaphragm microphone.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones are based on either a cantilever MEMS structure or a diaphragm MEMS structure.

The cantilever MEMS structure suffers from poor low-frequency roll-off control as the gap between cantilevers varies when cantilevers deflect due to residual stress. Additionally, the cantilever MEMS structure with gap control mechanism can have a complex structure that results in higher manufacturing costs and poor reliability performance. The diaphragm MEMS structure provides better low-frequency roll-off control and higher sensitivity than the cantilever MEMS structure, but suffers from sensitivity variation as residual stress causes large tensile or compression stresses within the diaphragm (e.g., a small residual stress results in a large sensitivity degradation for diaphragm type piezoelectric MEMS microphone).

SUMMARY OF CERTAIN INVENTIVE ASPECTS

Accordingly, there is a need for an improved piezoelectric MEMS microphone that does not suffer the deficiencies in existing MEMS cantilever and diaphragm structures.

In accordance with one aspect of the disclosure, a multi-piezoelectric-layer MEMS diaphragm microphone is provided that substantially cancels the overall residual stress in the diaphragm. The multi-piezoelectric-layer MEMS diaphragm microphone advantageously provides higher sensitivity (e.g., how much voltage is measured when diaphragm is provided to sound pressure) and better lower frequency roll-off as compared to the MEMS cantilever structure. The multi-piezoelectric-layer MEMS diaphragm microphone can optionally include two or more piezoelectric films with predefined residual stress (e.g., during film deposition) that substantially balance (e.g., cancel) out residual stress in the diaphragm structure.

In accordance with one aspect of the disclosure, a piezoelectric microelectromechanical systems diaphragm microphone is provided. The microphone can include a substrate defining an opening between a bottom end of the substrate and a top end of the substrate. The microphone can also include two or more piezoelectric film layers disposed over the top end of the substrate and defining a diaphragm structure. Each of the two or more piezoelectric film layers has a predefined residual stress that substantially cancel each other out so that the diaphragm structure is substantially flat with substantially zero residual stress. The microphone also comprises one or more electrodes disposed over the diaphragm structure. The diaphragm structure is configured to deflect when the diaphragm is subjected to sound pressure via the opening in the substrate.

In an embodiment, the diaphragm structure has a circular shape. The one or more electrodes that are disposed over the diaphragm structure can include a circumferential electrode that is disposed over a circumference of the diaphragm structure and a center electrode that is disposed generally over a center of the diaphragm structure. At least a portion of the center electrode can be spaced apart from the circumferential electrode.

In an embodiment, the diaphragm structure has a rectangular shape. The one or more electrodes that is disposed over the diaphragm structure can include a plurality of side electrodes that are disposed adjacent corresponding side edges of the diaphragm structure. The plurality of side electrodes can be spaced apart from each other and disposed around an area of the diaphragm structure that extends between the plurality of side electrodes.

In an embodiment, each of the one or more electrodes is divided into two or more electrode portions by one or more gaps between the electrode portions to provide a microphone with a desired sensitivity and capacitance. Each pair of the two or more electrode portions can be connected in series by a connection via.

In an embodiment, the microphone further includes a through hole in the diaphragm structure that extends from a top surface of the diaphragm structure to a bottom surface of the diaphragm structure. The through hole can be configured to define a low frequency roll off for the microphone.

In an embodiment, the microphone further includes a bottom electrode that is interposed between the substrate and two or more piezoelectric film layers, and a middle electrode that is interposed between two of the two or more piezoelectric film layers.

In accordance with another aspect of the disclosure, a radiofrequency module is provided. The radiofrequency module can include a printed circuit board including a substrate layer. The radiofrequency module can also include one or more piezoelectric microelectromechanical systems diaphragm microphones mounted on the printed circuit board. Each microphone includes a substrate defining an opening between a bottom end of the substrate and a top end of the substrate, and two or more piezoelectric film layers disposed over the top end of the substrate and defining a diaphragm structure. Each of the two or more piezoelectric film layers has a predefined residual stress that substantially cancel each other out so that the diaphragm structure is substantially flat with substantially zero residual stress. One or more electrodes are disposed over the diaphragm structure. The diaphragm structure is configured to deflect when the diaphragm is subjected to sound pressure via the opening in the substrate.

In an embodiment, the diaphragm structure has a circular shape. The one or more electrodes that are disposed over the diaphragm structure can include a circumferential electrode that is disposed over a circumference of the diaphragm structure and a center electrode that is disposed generally over a center of the diaphragm structure. At least a portion of the center electrode can be spaced apart from the circumferential electrode.

In an embodiment, the diaphragm structure has a rectangular shape. The diaphragm structure can have a square shape. The one or more electrodes that are disposed over the diaphragm structure can include a plurality of side electrodes that are disposed adjacent corresponding side edges of the diaphragm structure. The plurality of side electrodes can be spaced apart from each other and disposed around an area of the diaphragm structure that extends between the plurality of side electrodes.

In an embodiment, each of the one or more electrodes is divided into two or more electrode portions by one or more gaps between the electrode portions to provide a microphone with a desired sensitivity and capacitance. Each pair of the two or more electrode portions can be connected in series by a connection via.

In an embodiment, the radiofrequency module further includes a through hole in the diaphragm structure that extends from a top surface of the diaphragm structure to a bottom surface of the diaphragm structure. The through hole can be configured to define a low frequency roll off for the microphone.

In an embodiment, the radiofrequency module further includes a bottom electrode that is interposed between the substrate and two or more piezoelectric film layers, and a middle electrode that is interposed between two of the two or more piezoelectric film layers.

In accordance with another aspect of the disclosure, a wireless mobile device is provided. The wireless mobile device can include one or more antennas, a front end system that communicates with the one or more antennas, and one or more one or more piezoelectric microelectromechanical systems diaphragm microphones mounted on a substrate layer. Each microphone includes a substrate defining an opening between a bottom end of the substrate and a top end of the substrate, and two or more piezoelectric film layers disposed over the top end of the substrate and defining a diaphragm structure. Each of the two or more piezoelectric film layers has a predefined residual stress that substantially cancel each other out so that the diaphragm structure is substantially flat with substantially zero residual stress. One or more electrodes are disposed over the diaphragm structure. The diaphragm structure is configured to deflect when the diaphragm is subjected to sound pressure via the opening in the substrate.

In an embodiment, the diaphragm structure has a circular shape. The one or more electrodes that are disposed over the diaphragm structure can include a circumferential electrode that is disposed over a circumference of the diaphragm structure and a center electrode that is disposed generally over a center of the diaphragm structure. At least a portion of the center electrode can be spaced apart from the circumferential electrode.

In an embodiment, the diaphragm structure has a rectangular shape. The diaphragm structure can have a square shape. The one or more electrodes that are disposed over the diaphragm structure can include a plurality of side electrodes that are disposed adjacent corresponding side edges of the diaphragm structure. The plurality of side electrodes can be spaced apart from each other and disposed around an area of the diaphragm structure that extends between the plurality of side electrodes.

In an embodiment, each of the one or more electrodes is divided into two or more electrode portions by one or more gaps between the electrode portions to provide a microphone with a desired sensitivity and capacitance. Each pair of the two or more electrode portions can be connected in series by a connection via.

In an embodiment, the wireless mobile device further includes a through hole in the diaphragm structure that extends from a top surface of the diaphragm structure to a bottom surface of the diaphragm structure. The through hole can be configured to define a low frequency roll off for the microphone.

In an embodiment, the wireless mobile device further includes a bottom electrode that is interposed between the substrate and two or more piezoelectric film layers, and a middle electrode that is interposed between two of the two or more piezoelectric film layers.

In accordance with another aspect of the disclosure, a method of making a piezoelectric microelectromechanical systems diaphragm microphone is provided. The method can include the steps of: a) oxidizing a top surface and a bottom surface of a substrate to form a top oxidation layer and a bottom oxidation layer, b) forming or applying two or more piezoelectric film layers over the top surface of the substrate so that each of the two or more piezoelectric film layers has a predefined residual stress that substantially cancel each other out, the two or more piezoelectric film layers defining a substantially flat diaphragm structure with substantially zero residual stress, c) forming or applying one or more electrodes over the two or more piezoelectric film layers, and d) etching the bottom oxidation layer and substrate to form an opening in the substrate that allows sound pressure to travel through the opening to deflect the diaphragm structure.

In an embodiment, the diaphragm structure has a circular shape. Forming or applying the one or more electrodes over the two or more piezoelectric film layers can include forming or applying a circumferential electrode over a circumference of the diaphragm structure and forming or applying a center electrode generally over a center of the diaphragm structure. At least a portion of the center electrode can be spaced apart from the circumferential electrode.

In an embodiment, the diaphragm structure has a rectangular shape. Forming or applying the one or more electrodes over the two or more piezoelectric film layers can include forming or applying a plurality of side electrodes disposed adjacent corresponding side edges of the diaphragm structure. The plurality of side electrodes can be spaced apart from each other and disposed around an area of the diaphragm structure that extends between the plurality of side electrodes.

In an embodiment, the method further includes dividing the one or more electrodes into two or more electrode portions by forming one or more gaps between the electrode portions to provide a microphone with a desired sensitivity and capacitance. The method can further include connecting each pair of the two or more electrode portions in series with a connection via.

In an embodiment, the method further includes forming a through hole in the diaphragm structure from a top surface of the diaphragm structure to a bottom surface of the diaphragm structure to define a low frequency roll off for the microphone.

In an embodiment, the method further includes forming or applying a bottom electrode over the top surface of the substrate prior to forming or applying the two or more piezoelectric film layers. The method can further includes forming or applying a middle electrode between two of the two or more piezoelectric film layers.

In an embodiment, the method further includes forming or applying a passivation layer over the one or more electrodes that is disposed over the two or more piezoelectric film layers.

In an embodiment, forming or applying two or more piezoelectric film layers over the top surface of the substrate so that each of the two or more piezoelectric film layers has a predefined residual stress that substantially cancel each other out includes controlling one or both of a pressure and a bias voltage during a deposition process for the each of the two or more piezoelectric film layers In accordance with another aspect of the disclosure, a method of making a radiofrequency module is provided. The method can include the steps of forming or providing a printed circuit board that includes a substrate layer, and forming or providing one or more piezoelectric microelectromechanical systems diaphragm microphones. The process of forming or providing one or more piezoelectric microelectromechanical systems diaphragm microphones can include: (a) oxidizing a top surface and a bottom surface of a substrate to form a top oxidation layer and a bottom oxidation layer, (b) forming or applying two or more piezoelectric film layers over the top surface of the substrate so that each of the two or more piezoelectric film layers has a predefined residual stress that substantially cancel each other out, the two or more piezoelectric film layers defining a substantially flat diaphragm structure with substantially zero residual stress, (c) forming or applying one or more electrodes over the two or more piezoelectric film layers, and (d) etching the bottom oxidation layer and substrate to form an opening in the substrate that allows sound pressure to travel through the opening to deflect the diaphragm structure. The method of making the radiofrequency module also comprises the step of mounting the one or more piezoelectric microelectromechanical systems diaphragm microphones on the printed circuit board.

In an embodiment, the diaphragm structure has a circular shape. Forming or applying the one or more electrodes over the two or more piezoelectric film layers can include forming or applying a circumferential electrode over a circumference of the diaphragm structure and forming or applying a center electrode generally over a center of the diaphragm structure. At least a portion of the center electrode can be spaced apart from the circumferential electrode.

In an embodiment, the diaphragm structure has a rectangular shape. Forming or applying the one or more electrodes over the two or more piezoelectric film layers can include forming or applying a plurality of side electrodes disposed adjacent corresponding side edges of the diaphragm structure. The plurality of side electrodes can be spaced apart from each other and disposed around an area of the diaphragm structure that extends between the plurality of side electrodes.

In an embodiment, the method further includes dividing the one or more electrodes into two or more electrode portions by forming one or more gaps between the electrode portions to provide a microphone with a desired sensitivity and capacitance. The method can further include connecting each pair of the two or more electrode portions in series with a connection via.

In an embodiment, the method further includes forming a through hole in the diaphragm structure from a top surface of the diaphragm structure to a bottom surface of the diaphragm structure to define a low frequency roll off for the microphone.

In an embodiment, the method further includes forming or applying a bottom electrode over the top surface of the substrate prior to forming or applying the two or more piezoelectric film layers. The method can further include forming or applying a middle electrode between two of the two or more piezoelectric film layers.

In an embodiment, the method further includes forming or applying a passivation layer over the one or more electrodes that are disposed over the two or more piezoelectric film layers.

In an embodiment, forming or applying two or more piezoelectric film layers over the top surface of the substrate so that each of the two or more piezoelectric film layers has a predefined residual stress that substantially cancel each other out includes controlling one or both of a pressure and a bias voltage during a deposition process for the each of the two or more piezoelectric film layers.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
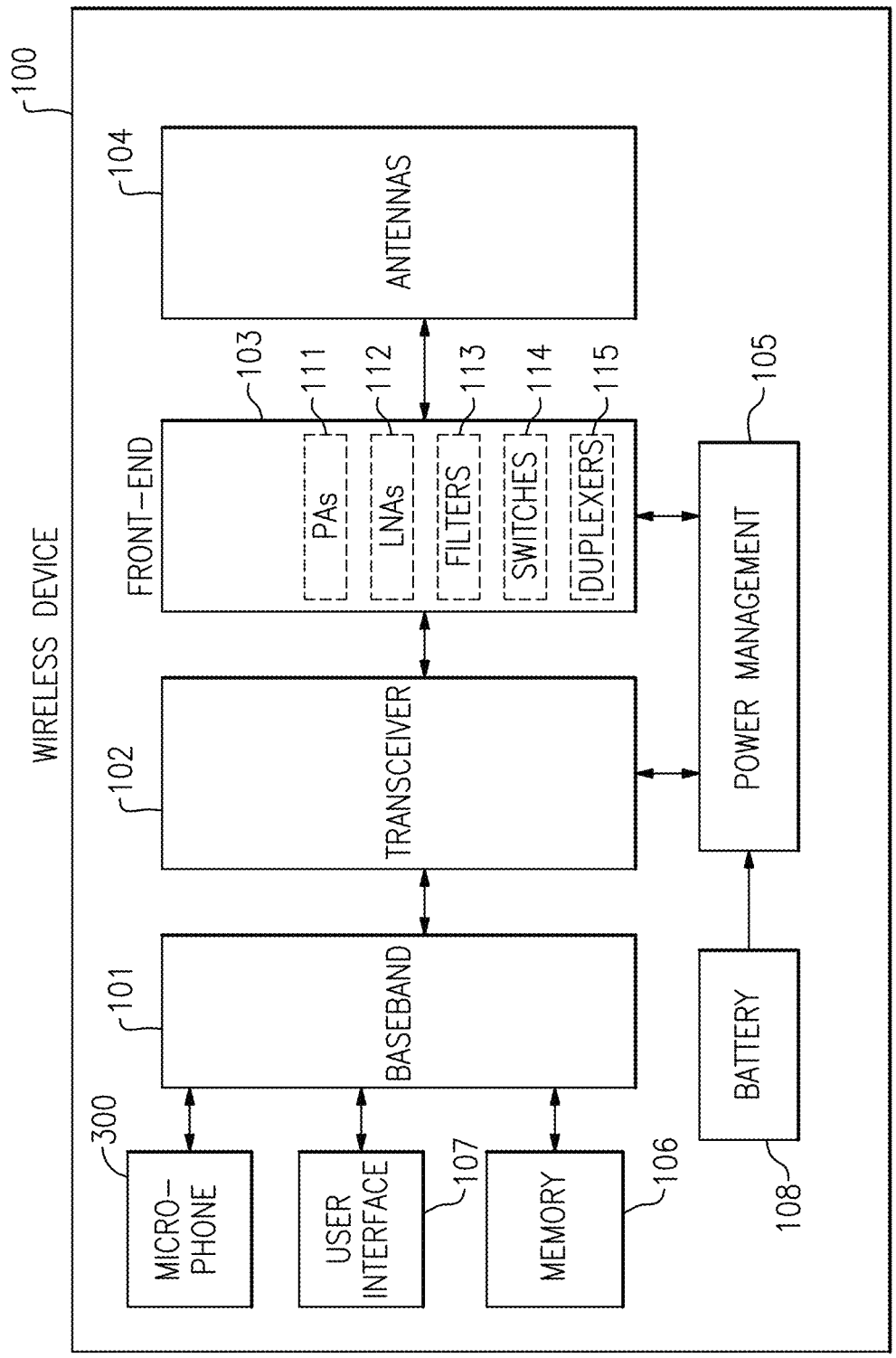
FIG. 1 is a schematic diagram of one embodiment of a wireless device.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one embodiment of a wireless device 100. The wireless device 100 can be, for example but not limited to, a portable telecommunication device such as a mobile cellular-type telephone. The wireless device 100 can include one or more of a baseband system 101, a transceiver 102, a front end system 103, one or more antennas 104, a power management system 105, a memory 106, a user interface 107, a battery 108 (e.g., direct current (DC) battery), and a microphone 300 (e.g., a piezoelectric MEMS diaphragm microphone). Other additional components, such as a speaker, display and keyboard can optionally be connected to the baseband system 101. The battery 108 can provide power to the wireless device 100. The microphone 300 can supply signals to the baseband system 101.

It should be noted that, for simplicity, only certain components of the wireless device 100 are illustrated herein. The control signals provided by the baseband system 101 can control the various components within the wireless device 100. Further, the function of the transceiver 102 can be integrated into separate transmitter and receiver components.

The wireless device 100 can communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receipt of RF signals can be achieved by one or more components that are collectively represented in FIG. 1 as the transceiver 102. In one example, separate components (for instance, separate circuits or dies) can be provided for handling certain types of RF signals.

The front end system 103 aids in conditioning signals transmitted to and/or received from the antennas 104. In the illustrated embodiment, the front end system 103 includes one or more power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the wireless device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 104 can include antennas used for a wide variety of types of communications. For example, the antennas 104 can include antennas for transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 can be controlled such that radiated signals from the antennas 104 combine using constructive and destructive interference to generate an aggregate transmit signal exhibiting beam-like qualities with more signal strength propagating in a given direction. In the context of signal reception, the phases can be controlled such that more signal energy is received when the signal is arriving to the antennas 104 from a particular direction. In certain implementations, the antennas 104 can include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the wireless device 100.

The memory 106 can be used for a wide variety of purposes, such as storing data and/or instructions to facilitate the operation of the wireless device 100 and/or to provide storage of user information.

The power management system 105 provides a number of power management functions of the wireless device 100. In certain implementations, the power management system 105 includes a PA supply control circuit that controls the supply voltages of the power amplifiers 111. For example, the power management system 105 can be configured to change the supply voltage(s) provided to one or more of the power amplifiers 111 to improve efficiency, such as power added efficiency (PAE).

As shown in FIG. 1, the power management system 105 receives a battery voltage from the battery 108. The battery 108 can be any suitable battery for use in the wireless device 100, including, for example, a lithium-ion battery.

Figure 2A:
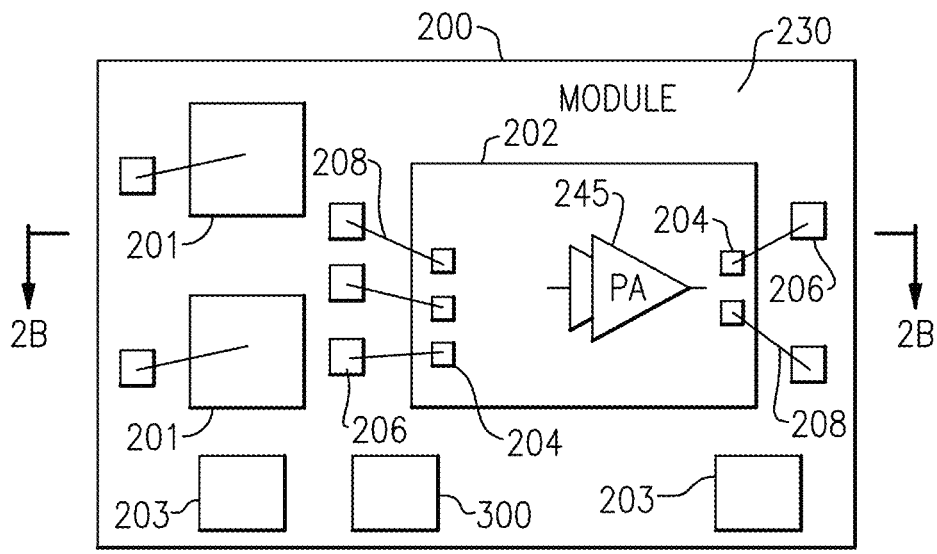
FIG. 2A is a schematic diagram of one embodiment of a packaged module.
Figure 2B:
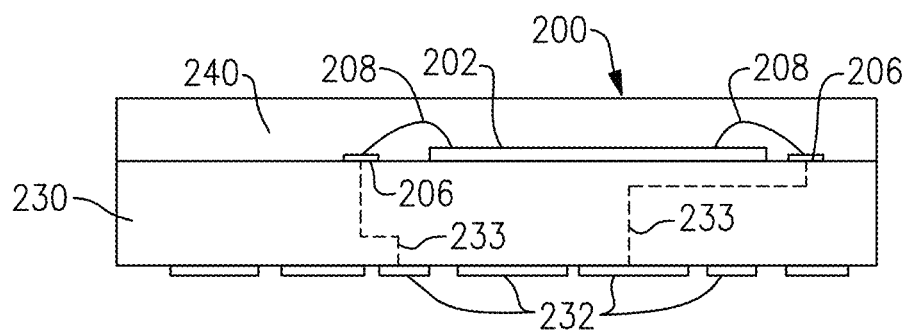
FIG. 2B is a schematic diagram of a cross-section of the packaged module of FIG. 2A taken along the lines 2B-2B.

FIG. 2A is a schematic diagram of one embodiment of a packaged module 200. FIG. 2B is a schematic diagram of a cross-section of the packaged module 200 of FIG. 2A taken along the lines 2B-2B.

The packaged module 200 includes radio frequency components 201, a semiconductor die 202, surface mount devices 203, wirebonds 208, a package substrate 230, and an encapsulation structure 240. One or more of the surface mounted devices (SMDs) 203 can be a microphone 300 (e.g., a piezoelectric MEMS diaphragm microphone). The package substrate 230 includes pads 206 formed from conductors disposed therein. Additionally, the semiconductor die 202 includes pins or pads 204, and the wirebonds 208 have been used to connect the pads 204 of the die 202 to the pads 206 of the package substrate 220.

The semiconductor die 202 includes a power amplifier 245, which can be implemented in accordance with one or more features disclosed herein.

The package substrate 230 can be configured to receive a plurality of components such as radio frequency components 201, the semiconductor die 202 and the surface mount devices 203, which can include, for example, surface mount capacitors and/or inductors. In one implementation, the radio frequency components 201 include integrated passive devices (IPDs).

As shown in FIG. 2B, the packaged module 200 is shown to include a plurality of contact pads 232 disposed on the side of the packaged module 200 opposite the side used to mount the semiconductor die 202. Configuring the packaged module 200 in this manner can aid in connecting the packaged module 200 to a circuit board, such as a phone board of a mobile device. The example contact pads 232 can be configured to provide radio frequency signals, bias signals, and/or power (for example, a power supply voltage and ground) to the semiconductor die 202 and/or other components. As shown in FIG. 2B, the electrical connections between the contact pads 232 and the semiconductor die 202 can be facilitated by connections 233 through the package substrate 230. The connections 233 can represent electrical paths formed through the package substrate 220, such as connections associated with vias and conductors of a multilayer laminated package substrate.

In some embodiments, the packaged module 200 can also include one or more packaging structures to, for example, provide protection and/or facilitate handling. Such a packaging structure can include overmold or encapsulation structure 240 formed over the package substrate 230 and the components and die(s) disposed thereon.

It will be understood that although the packaged module 200 is described in the context of electrical connections based on wirebonds, one or more features of the present disclosure can also be implemented in other packaging configurations, including, for example, flip-chip configurations.

Piezoelectric MEMS Microphone

Figure 3:
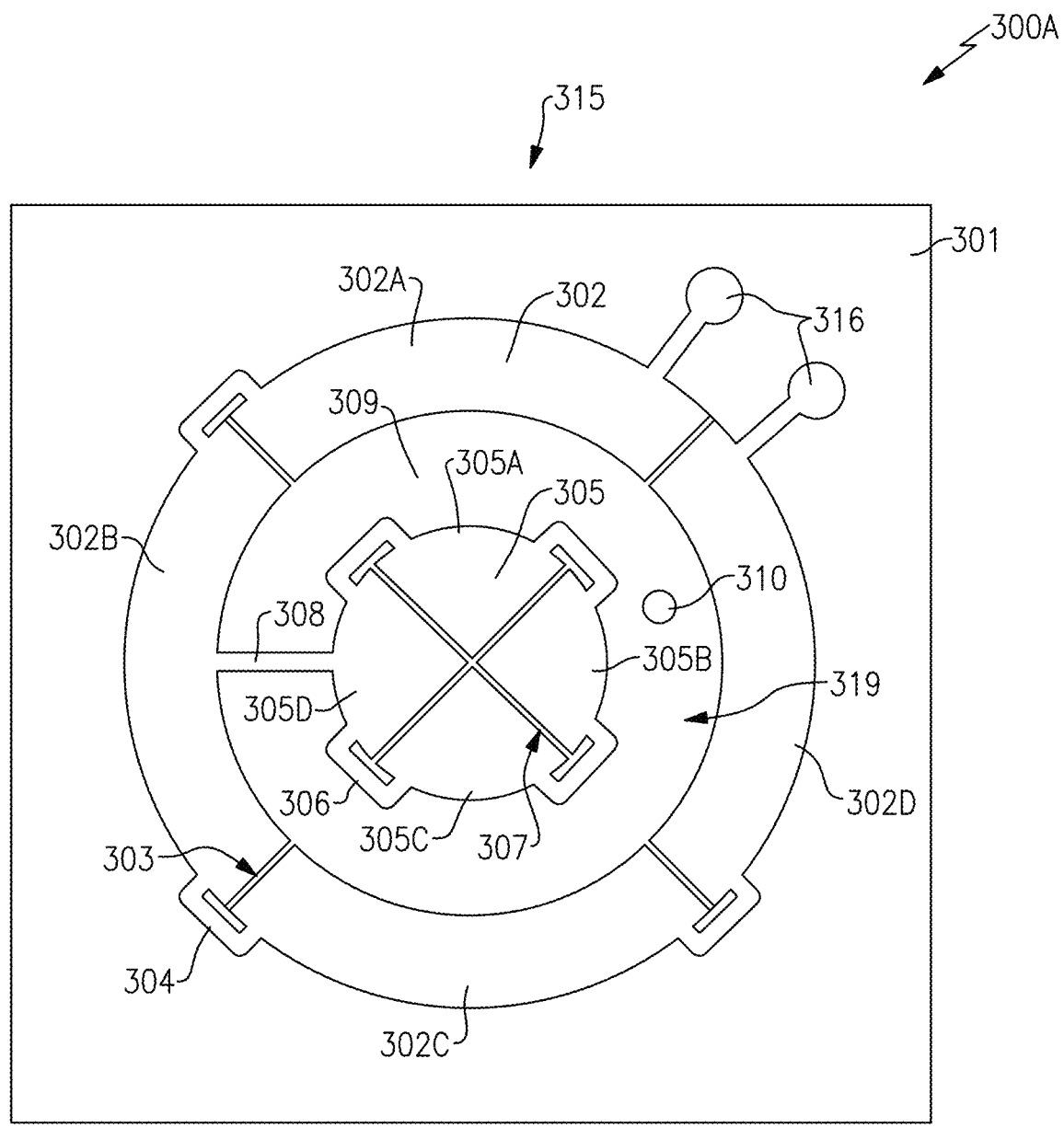
FIG. 3 is a top view of a piezoelectric MEMS circular diaphragm microphone.
Figure 4:
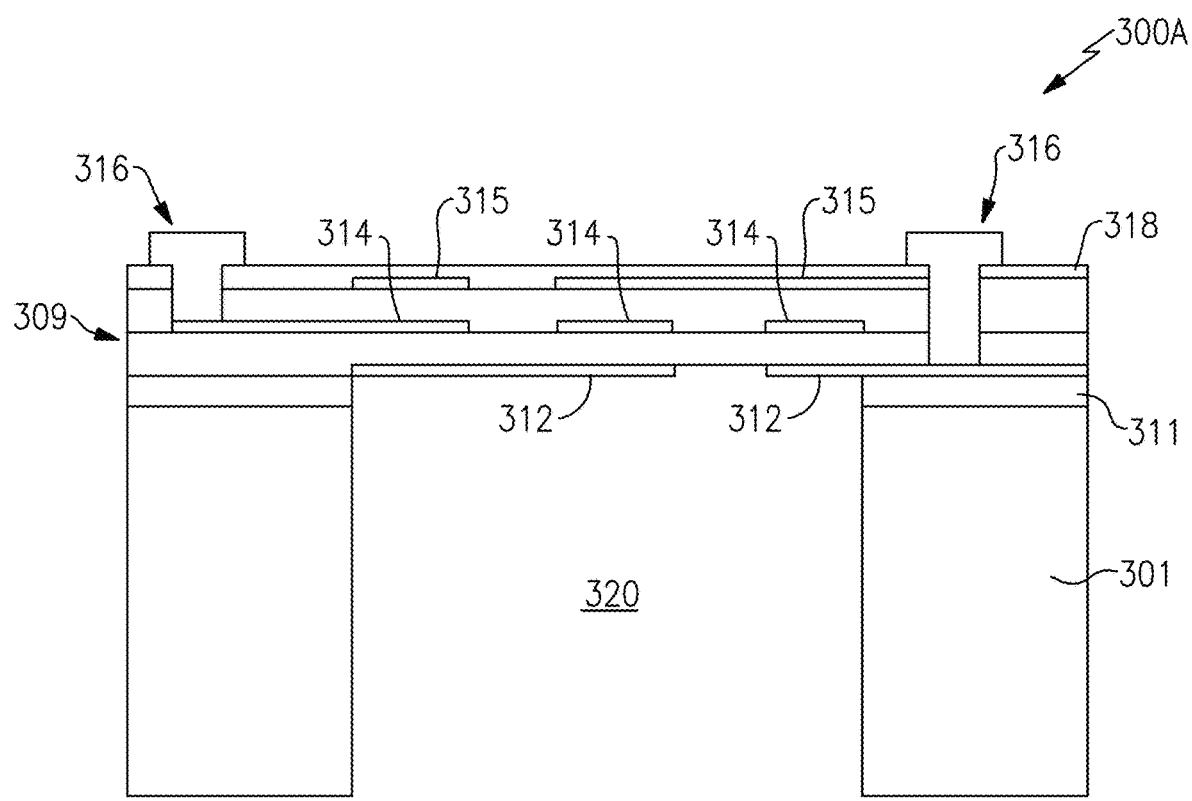
FIG. 4 is a cross-sectional side view of the piezoelectric MEMS diaphragm microphone of FIG. 3.

FIGS. 3-4 show one implementation of a piezoelectric microelectromechanical systems (MEMS) diaphragm microphone 300A (hereinafter the "microphone"). The microphone 300A has a substrate 301. The substrate 301 is optionally made of Silicon. An insulation layer 311 is disposed on a surface of the substrate 301. The insulation layer 311 is optionally silicon dioxide. A first electrode 312 (e.g., a "bottom" electrode) is disposed on the oxide layer 311. One or more piezoelectric film layers 309 (e.g., multiple layers or multi-layer) are disposed on the first electrode 312. In FIG. 4, two piezoelectric film layers 309 are shown. At least one of the one or more piezoelectric film layers 309 are optionally made of aluminum nitride (AlN). In another implementation, at least one of the one or more piezoelectric film layers 309 are optionally made of aluminum scandium nitride (AlScN). In still another implementation, at least one of the one or more piezoelectric film layers 309 can be made of other suitable materials, such as zinc oxide. A second electrode 314 (e.g., a "middle" electrode) is disposed between at least two of the one or more piezoelectric film layers 309. A third electrode 315 (e.g., a "top" electrode) is disposed on top of the one or more piezoelectric film layers 309, and a passivation layer 318 is disposed over the third electrode 315 and at least partially defines a top surface of the microphone 300A. In one implementation, the passivation layer 318 is optionally titanium nitride (TiN). The one or more piezoelectric film layers 309 define a diaphragm 319.

With reference to FIG. 3, the microphone 300A can have a generally circular or round shape. However, as discussed further below, the microphone 300A can have other suitable shapes. The third electrode 315 can include an outer circumferential electrode 302 and a center electrode 305. The outer circumferential electrode 302 can optionally be divided into two or more portions 302A-302D by one or more gaps 303 between the portions 302A-302D. The two or more portions 302A-302D can optionally be connected in series with each other by one or more connection vias 304. Optionally, the gaps 303 can completely separate the portions 302A-302D so that the portions 302A-302D are solely connected by the connection vias 304. The gaps 303 can advantageously control the amount of capacitance provided by the electrodes 302 (e.g., if want a higher capacitance then fewer gaps 303 are provided; if want a lower capacitance then more gaps 303 are provided). The reduction in capacitance (e.g., due to increased number of gaps 303) results in increased sensitivity, and the increase in capacitance (e.g., due to reduced number of gaps 303) results in reduced sensitivity. Therefore, sensitivity and capacitance can advantageously be balanced as desired via the use of such gaps 303, 307 to divide the electrodes 302, 305. The center electrode 305 can optionally be divided into two or more portions 305A-305D by one or more gaps 307 between the portions 305A-305D. The two or more portions 305A-305D can optionally be connected in series with each other by one or more connection vias 306 (e.g., which can further reduce the capacitance value of the electrode 302). Optionally, the gaps 307 can completely separate the portions 305A-305D so that the portions 305A-305D are solely connected by the connection vias 306. The center electrode 305 can connect with the circumferential electrode 302 by a connector 308. The microphone 300A can have one or more bond pads 316 connected to the circumferential electrode 302.

The center electrode 305 can be spaced from the circumferential electrode 302 so that the center electrode 305 is substantially centered relative to the circumferential electrode 302 (e.g., both electrodes 302, 305 have the same central axis), with at least a portion of the diaphragm 319 extending between the circumferential electrode 302 and the center electrode 305. As shown in FIGS. 3-4, the diaphragm 319 can extend beneath the circumferential electrode 302 and beneath the center electrode 305. A through hole 310 can be formed (e.g., etched) in the diaphragm 319 (e.g., in the one or more piezoelectric film layers 309 that define the diaphragm 319) at a location between the circumferential electrode 302 and the center electrode 305. The through hole 310 can extend from a top surface of the diaphragm 319 to a bottom surface of the diaphragm 319 to thereby extend completely through the diaphragm 319. The microphone 300A can have an opening 320 in the substrate 301 that is located underneath the diaphragm 319, which allows the diaphragm 319 to move (e.g., deflect).

With continued reference to FIG. 3, the electrodes 302, 305 are advantageously located (e.g., electrode 302 along the periphery and electrode 305 at the center of the diaphragm structure 319) where the highest stress, therefore highest output voltage or electrical energy via piezoelectric effect, is induced by sound pressure exerted on the diaphragm 319 (e.g., via air pressure delivered through the opening 320 toward the diaphragm 319). As discussed further below, the one or more piezoelectric film layers 309 can be multiple layers (e.g., two), each having a predefined residual stress, where such residual stresses of the multiple layers balance (e.g., cancel each other out) in the combined diaphragm structure 319, thereby advantageously providing a diaphragm structure 319 with approximately zero (e.g., zero) residual stress.

Figure 5:
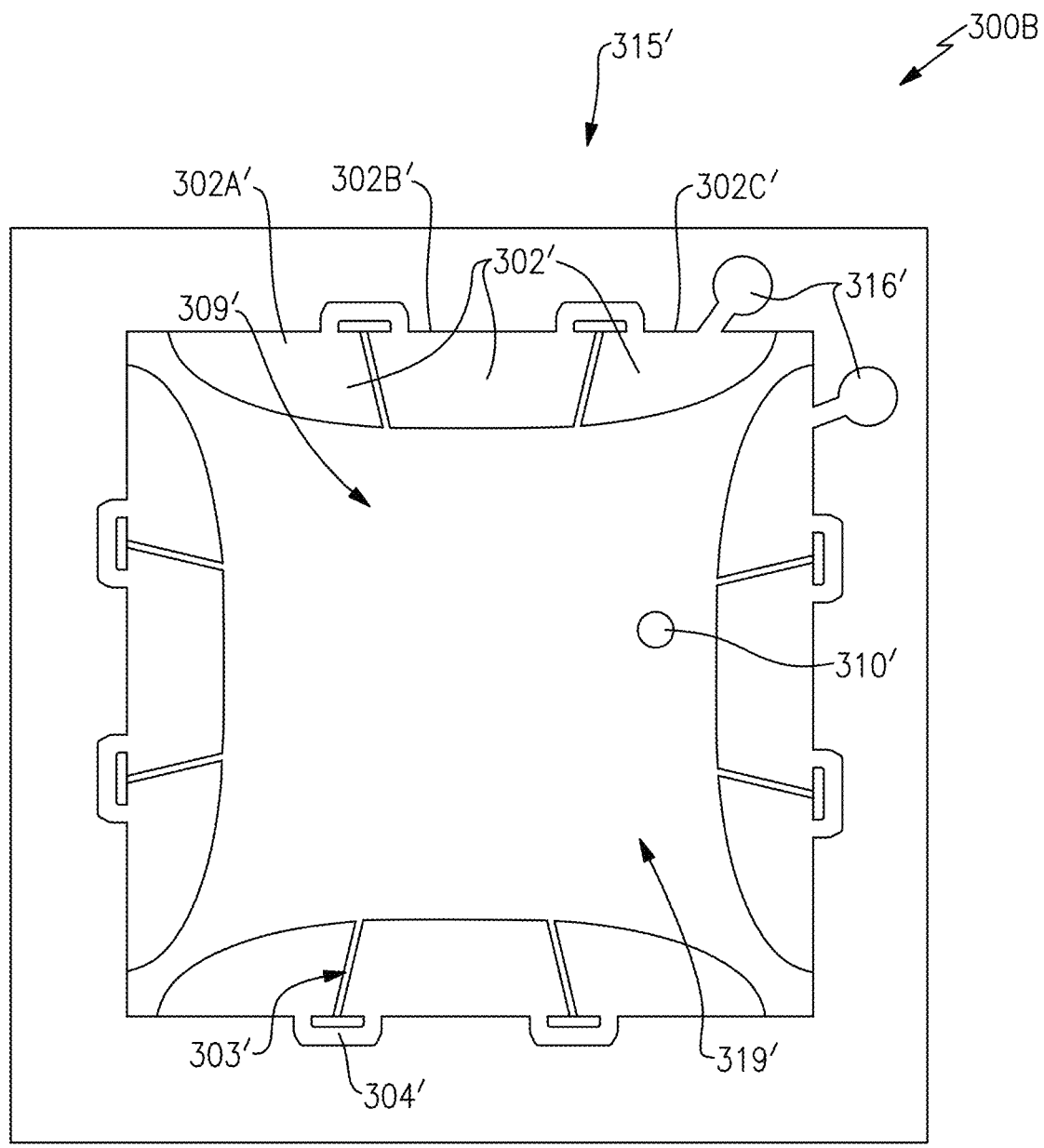
FIG. 5 is a top view of a piezoelectric MEMS rectangular diaphragm microphone.
Figure 6:
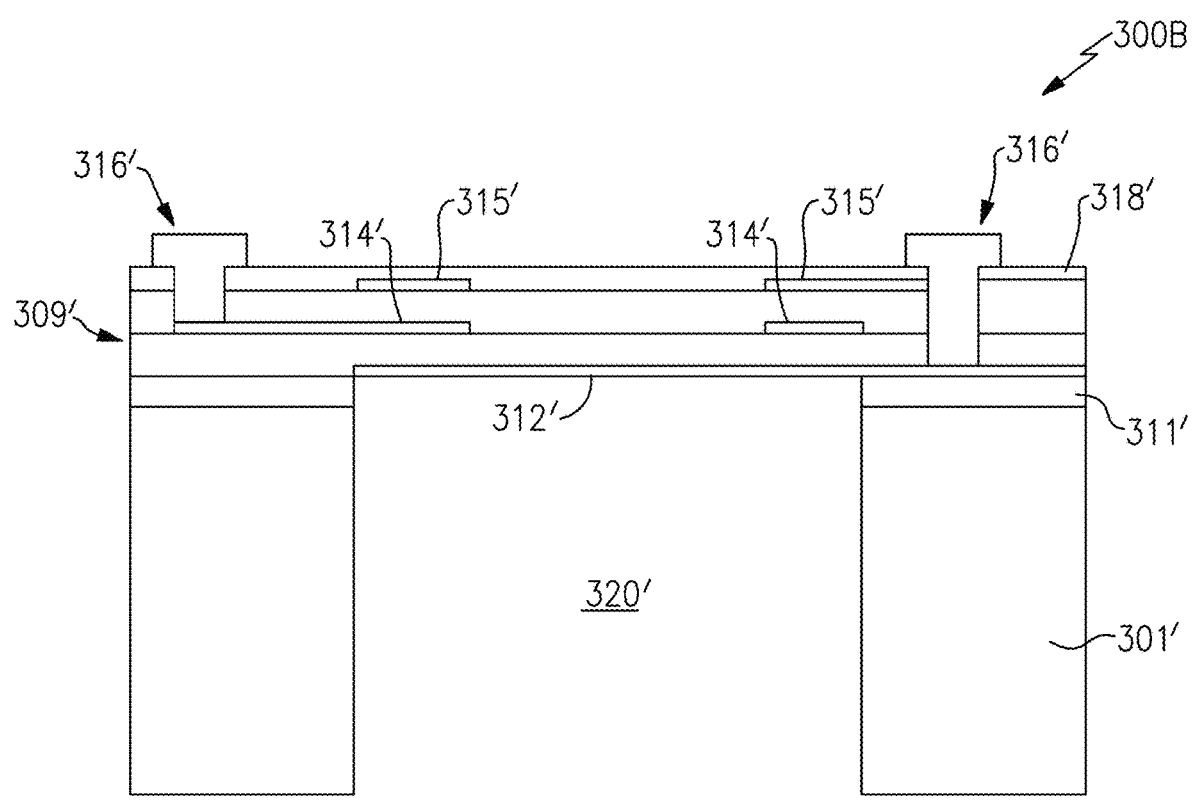
FIG. 6 is a cross-sectional side view of the piezoelectric MEMS diaphragm microphone of FIG. 5.

FIGS. 5-6 show another implementation of a piezoelectric microelectromechanical systems (MEMS) diaphragm microphone 300B (hereinafter the "microphone"). The microphone 300B has a substrate 301'. The substrate 301' is optionally made of Silicon. An insulation layer 311' is disposed on a surface of the substrate 301'. The insulation layer 311' is optionally Silicon dioxide. A first electrode 312' (e.g., a "bottom" electrode) is disposed on the oxide layer 311'. One or more piezoelectric film layers 309' (e.g., multiple layers or multi-layer) are disposed on the first electrode 312'. In FIG. 6, two piezoelectric film layers 309' are shown. At least one of the one or more piezoelectric film layers 309' are optionally made of aluminum nitride (AlN).

In another implementation, at least one of the one or more piezoelectric film layers 309' are optionally made of aluminum scandium nitride (AlScN). A second electrode 314' (e.g., a "middle" electrode) is disposed between at least two of the one or more piezoelectric film layers 309'. A third electrode 315' (e.g., a "top" electrode) is disposed on top of the one or more piezoelectric film layers 309', and a passivation layer 318' is disposed over the third electrode 315' and at least partially defines a top surface of the microphone 300B. In one implementation, the passivation layer 318' is optionally titanium nitride (TiN). The one or more piezoelectric film layers 309' define a diaphragm 319'.

With reference to FIG. 5, the microphone 300B can have a generally rectangular (e.g., square) shape. However, the microphone 300B can have other suitable shapes. The third electrode 315' can include one or more side electrodes 302' adjacent one or more sides of the diaphragm 319'. In FIG. 5, the third electrode 315' includes four side electrodes 302', each adjacent a side of the rectangular (e.g., square) shape of the diaphragm 319'. Each of the side electrodes 302' can optionally be divided into two or more portions 302A', 302B', 302C' by one or more gaps 303' between the portions 302A', 302B', 302C'. The gaps 303' can advantageously control the amount of capacitance provided by the electrodes 302' (e.g., if want a higher capacitance then fewer gaps 303' are provided; if want a lower capacitance then more gaps 303' are provided). The reduction in capacitance (e.g., due to increased number of gaps 303) results in increased sensitivity, and the increase in capacitance (e.g., due to reduced number of gaps 303) results in reduced sensitivity. Therefore, sensitivity and capacitance can advantageously be balanced as desired via the use of such gaps 303', 307' to divide the electrodes 302'. The two or more portions 302A', 302B', 302C' can optionally be connected in series with each other by one or more connection vias 304' (e.g., which can further reduce the capacitance value of the electrode 302'). Optionally, the gaps 303' can completely separate the portions 302A', 302B', 302C' so that the portions 302A', 302B', 302C' are solely connected by the connection vias 304'. In one implementation, a center electrode (e.g., divided into two or more electrodes connected in series), similar to the center electrode 305 with electrode portions 305A-305D in FIG. 3, can optionally be added to the rectangular diaphragm 319' to improve output energy and provide more flexibility for balancing sensitivity and capacitance. The microphone 300B can have one or more bond pads 316' connected to two of the one or more side electrodes 302'.

As shown in FIGS. 5-6, the diaphragm 319' can extend beneath the side electrodes 302' and across a center portion of the microphone 300B between opposite side electrodes 302'. A through hole 310' can be formed (e.g., etched) in the diaphragm 319' (e.g., in the one or more piezoelectric film layers 309' that define the diaphragm 319') at a location between opposing side electrodes 302'. The through hole 310' can extend from a top surface of the diaphragm 319' to a bottom surface of the diaphragm 319' to thereby extend completely through the diaphragm 319'. The microphone 300B can have an opening 320' in the substrate 301' that is located underneath the diaphragm 319', which allows the diaphragm 319' to move.

With continued reference to FIG. 5, the electrodes 302' are advantageously located where the highest stress is induced, therefore highest output voltage or electrical energy via piezoelectric effect, (e.g., along the sides of the diaphragm structure 319') by sound pressure exerted on the diaphragm 319' (e.g., via air pressure delivered through the opening 320' toward the diaphragm 319'). As discussed further below, the one or more piezoelectric film layers 309' can be multiple layers (e.g., two), each having a predefined residual stress, where such residual stresses of the multiple layers balance (e.g., cancel each other out) in the combined diaphragm structure 319', thereby advantageously providing a diaphragm structure 319' with approximately zero (e.g., zero) residual stress.

The through holes 310, 310' in the diaphragms 319, 319' of the microphones 300A, 300B can advantageously allow the low frequency roll off of the microphone 300A, 300B to be defined substantially precisely (e.g., at approximately 85 Hz±15 Hz, such as for cell phone applications). That is, the size of the through hole 310, 310' can advantageously provide the desired value for the low frequency roll off (e.g., there is a correlation between the size of the through hole and the value of the low frequency roll off).

The diaphragm 319, 319' of the microphone 300A, 300B has a multi-layer structure (e.g., one or more piezoelectric film layers 309, such as two layers, three layers, four layers, etc.) that advantageously provides higher sensitivity (about 2-3 dB higher) and better low-frequency roll-off control (−3 dB frequency) than cantilever structures. The diaphragm 319, 319' with multi-layers structure also has higher sensitivity than a single layer diaphragm. The one or more piezoelectric film layers 309, 309' (e.g., two layers, three layers, four layers, five layers, etc.) of the diaphragm 319, 319' in the microphone 300A, 300B each have residual stresses (e.g., pre-defined residual stresses introduced during the deposition process) that advantageously cancel each other out to provide a substantially flat (e.g., flat) diaphragm 309, 309' that is substantially residual-stress free (e.g., so that the overall residual stress is approximately zero). The one or more piezoelectric film layers 309, 309' can in one implementation be an even number of layers (e.g., two, four, six, etc.). In another implementation, the one or more piezoelectric film layers 309, 309' can be an odd number of layers (e.g., three, five, seven, etc.).

Figure 7A:
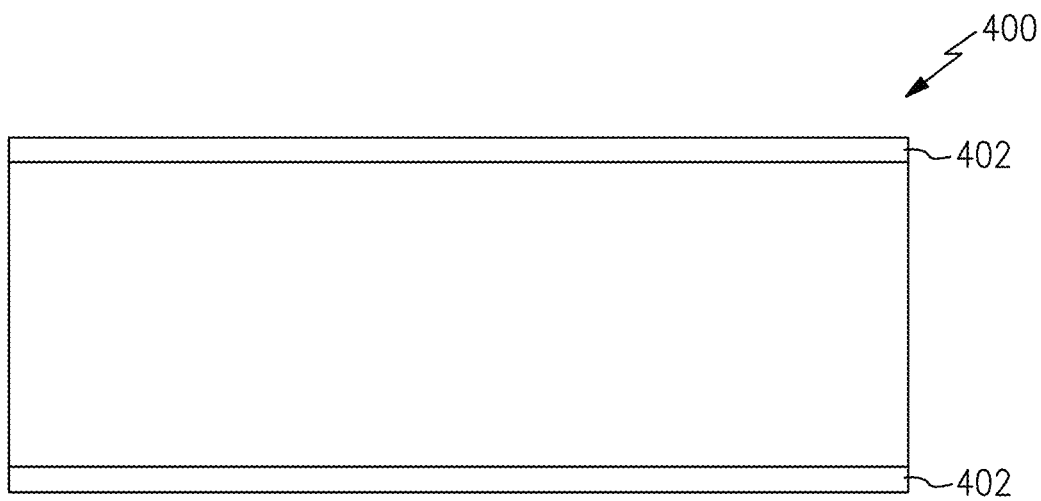
FIG. 7A is a cross-sectional side view of one step in the manufacture of a piezoelectric MEMS diaphragm microphone.
Figure 7B:
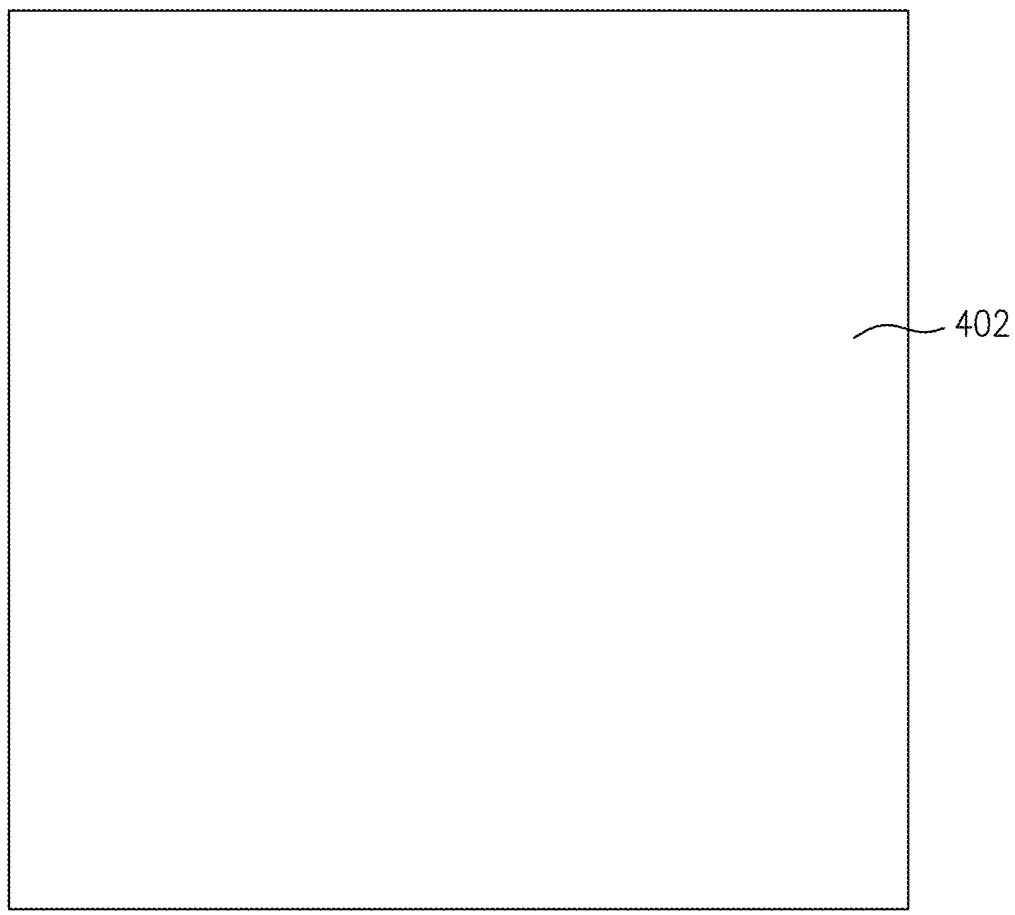
FIG. 7B is a top view of the structure in FIG. 7A.

FIGS. 7A-19B show steps of a method 400 of manufacturing a piezoelectric MEMS diaphragm microphone. Though FIGS. 7A-19B show the method 400 for manufacturing the microphone 300A, one of skill in the art will recognize that the method 400 can also be used to manufacture the microphone 300B. FIGS. 7A-7B show a cross-sectional view and a top view, respectively, of the step of oxidizing 402 one or both of a top side and a bottom side of a substrate (such as the substrate 301, 301') to form an oxidation layer, such as oxidation layer 311, 311'. Optionally, the oxidizing can be performed with a thermal oxidation furnace. In one implementation, the oxidation layer (e.g., oxidation layer 311, 311') optionally has a thickness of approximately 2-3 μm. The top oxidation layer can provide isolation between the substrate 301, 301' and the one or more piezoelectric film layers 309, 309'. The bottom oxidation layer can be used as a hard mask to define a window for later etching the opening 320, 320' into the microphone 300A, 300B. The substrate 301, 301' can be made of Silicon, and the oxidation layers can be of Silicon dioxide.

Figure 8A:
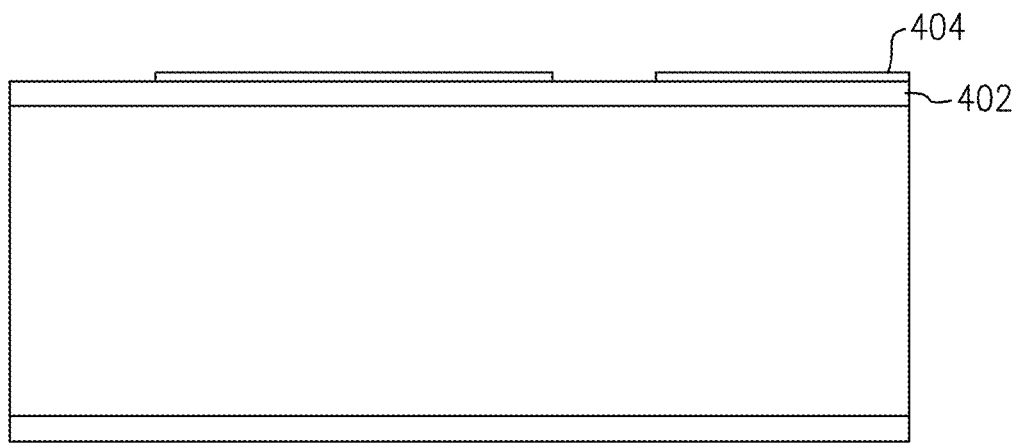
FIG. 8A is a cross-sectional side view of another step in the manufacture of a piezoelectric MEMS diaphragm microphone.
Figure 8B:
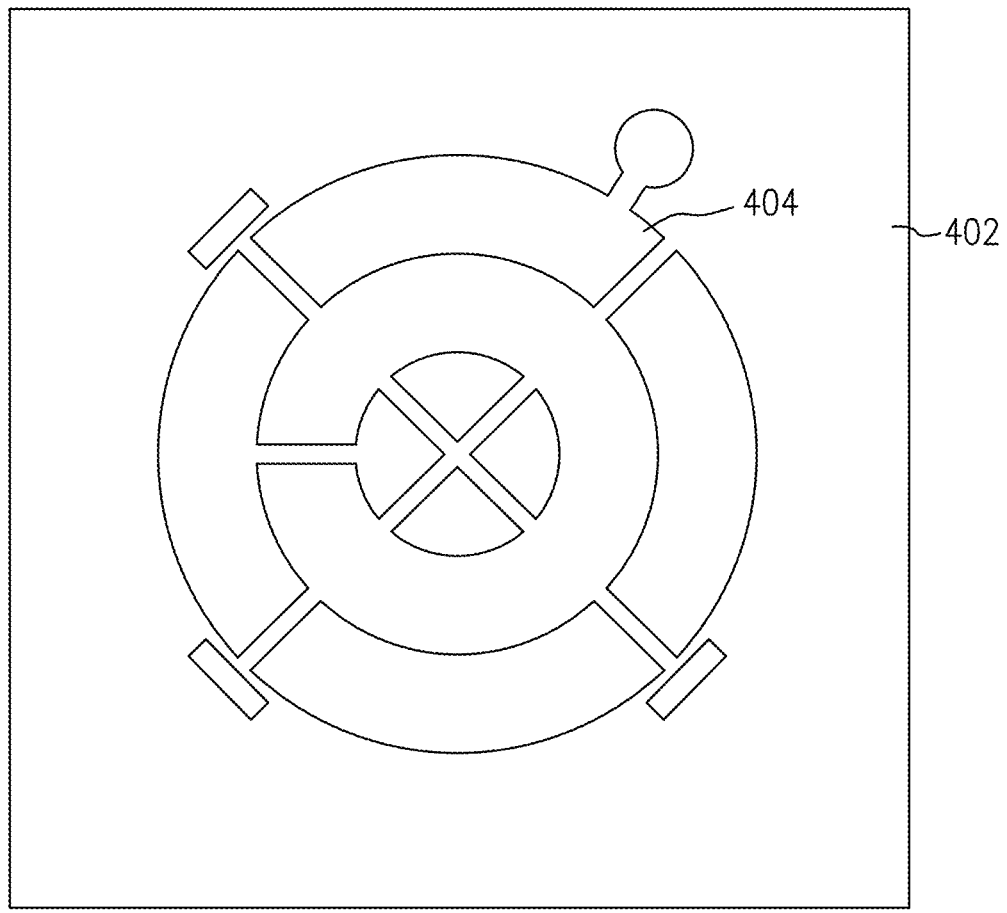
FIG. 8B is a top view of the structure in FIG. 8A.

FIGS. 8A-8B show a cross-sectional view and a top view, respectively, of the step of forming or applying 404 (e.g., and patterning, such as using wet etching, dry etching, etc.) a first electrode (e.g., the "bottom" electrode), such as the first electrode 312, 312' on the top oxidation layer (e.g., oxidation layer 311, 311'). Optionally, the first electrode can be formed or applied 404 using a sputter machine and patterned by dry etching (e.g., using Reactive Ion Etch (RIE) and/or Inductively Coupled Plasma (ICP) etch). In one implementation, the first electrode (e.g., first electrode 312, 312') optionally has a thickness of approximately 30 nm.

Figure 9A:
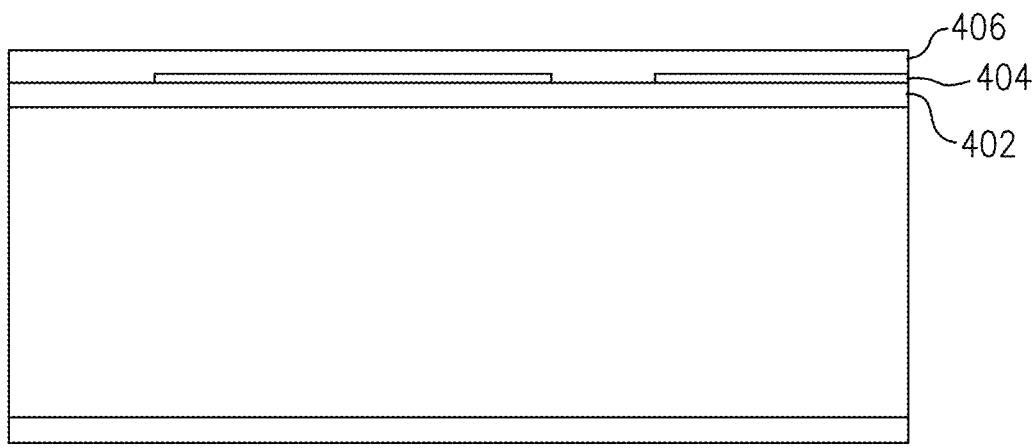
FIG. 9A is a cross-sectional side view of another step in the manufacture of a piezoelectric MEMS diaphragm microphone.
Figure 9B:
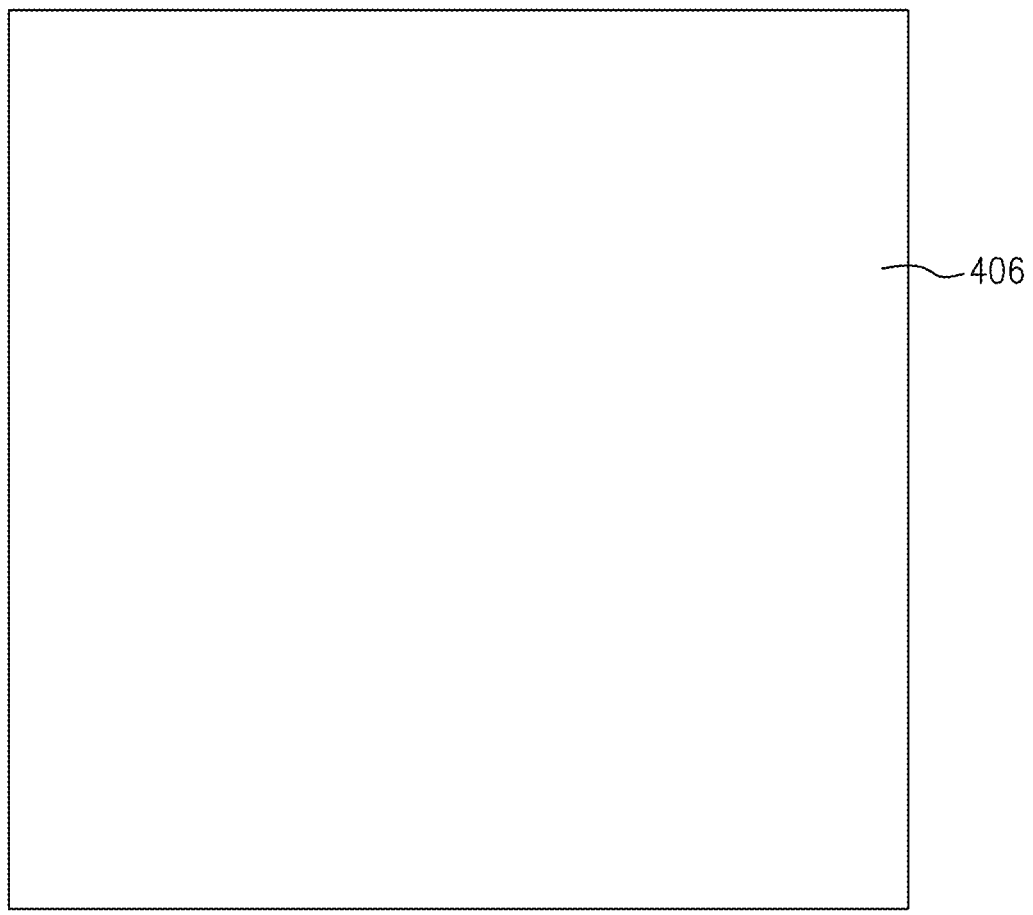
FIG. 9B is a top view of the structure in FIG. 9A.

FIGS. 9A-9B show a cross-sectional view and a top view, respectively, of the step of forming or applying 406 (e.g., via deposition) 406 one or more piezoelectric film layers, such as piezoelectric film layers 309, on top (e.g., adjacent to, attached to) the first electrode. Optionally, the one or more piezoelectric film layers are formed or applied using a sputter machine. As discussed above, the one or more piezoelectric film layers can optionally be made of aluminum nitride (AlN) or aluminum scandium nitride (AlScN). In one implementation, the one or more piezoelectric film layers can optionally have a total thickness of approximately 500 nm. Optionally, the one or more piezoelectric film layers are applied so that each layer has a predefined residual stress. For example, where the piezoelectric material is aluminum nitride, one or both of the pressure of the deposition chamber and the radiofrequency bias voltage applied can be controlled to provide a pre-defined residual stress to each of the piezoelectric film layers applied (e.g., residual stress can be gradually controlled using pressure and/or bias voltage during the deposition process based on a known correlation between residual stress and one or both of pressure and bias voltage).

Figure 10A:
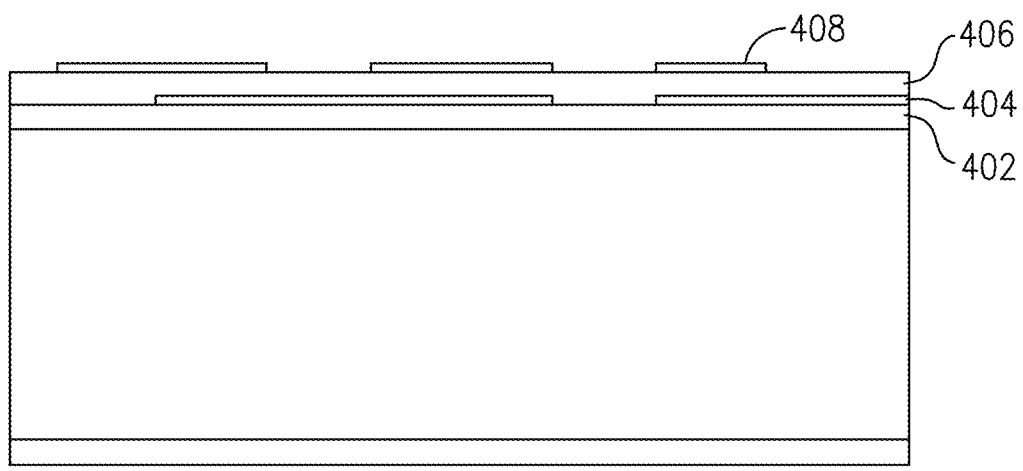
FIG. 10A is a cross-sectional side view of another step in the manufacture of a piezoelectric MEMS diaphragm microphone.
Figure 10B:
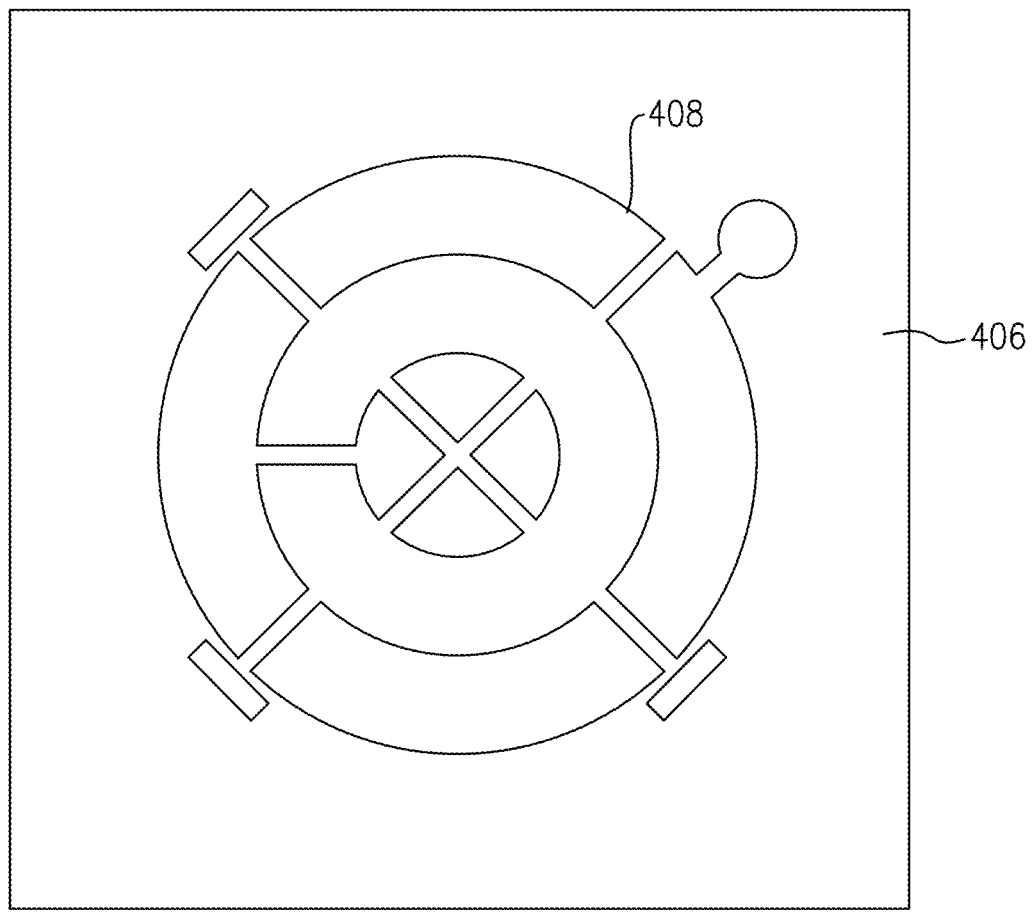
FIG. 10B is a top view of the structure in FIG. 10A.

FIGS. 10A-10B show a cross-sectional view and a top view, respectively of the step of forming or applying 408 (e.g., and patterning, such as using wet etching, dry etching, etc.) a second electrode (e.g., the "middle" electrode), such as the second electrode 314, 314' onto (e.g., adjacent to, attached to) the one or more piezoelectric film layers, such as the piezoelectric film layers 309. Optionally, the second electrode can be formed or applied 408 using a sputter machine and patterned by dry etching (e.g., using Reactive Ion Etch (ME) and/or Inductively Coupled Plasma (ICP) etch). In one implementation, the second electrode (e.g., second electrode 314, 314') optionally has a thickness of approximately 30 nm.

Figure 11A:
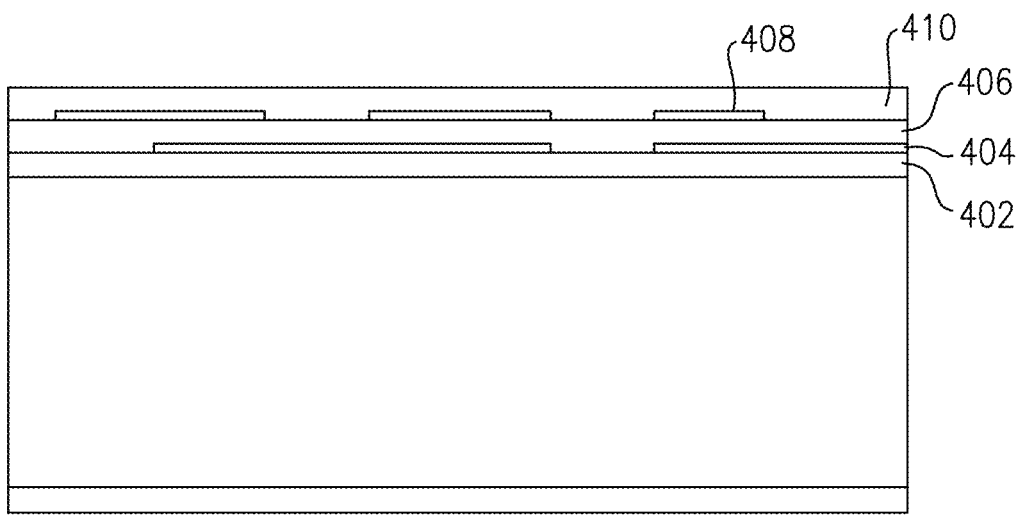
FIG. 11A is a cross-sectional side view of another step in the manufacture of a piezoelectric MEMS diaphragm microphone.
Figure 11B:
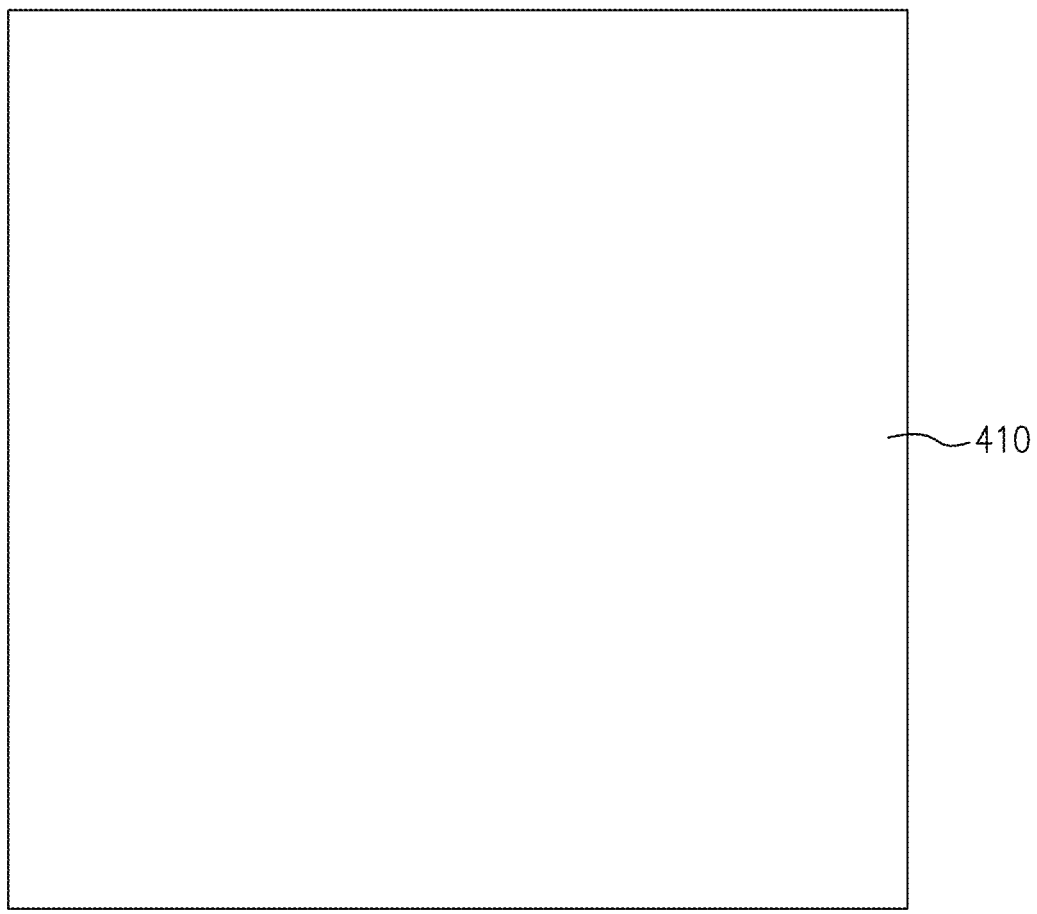
FIG. 11B is a top view of the structure in FIG. 11A.

FIGS. 11A-11B show a cross-sectional view and a top view, respectively, of the step of forming or applying 410 (e.g., via deposition) one or more piezoelectric film layers, such as piezoelectric film layers 309, on top (e.g., adjacent to, attached to) of the second electrode. Optionally, the one or more piezoelectric film layers are formed or applied using a sputter machine. As discussed above, the one or more piezoelectric film layers can optionally be made of aluminum nitride (AlN) or aluminum scandium nitride (AlScN). In one implementation, the one or more piezoelectric film layers can optionally have a total thickness of approximately 500 nm. Optionally, the one or more piezoelectric film layers are applied so that each layer has a predefined residual stress. For example, where the piezoelectric material is aluminum nitride, one or both of the pressure of the deposition chamber and the radiofrequency bias voltage applied can be controlled to provide a pre-defined residual stress to each of the piezoelectric film layers applied (e.g., residual stress can be gradually controlled using pressure and/or bias voltage during the deposition process based on a known correlation between residual stress and one or both of pressure and bias voltage).

Figure 12A:
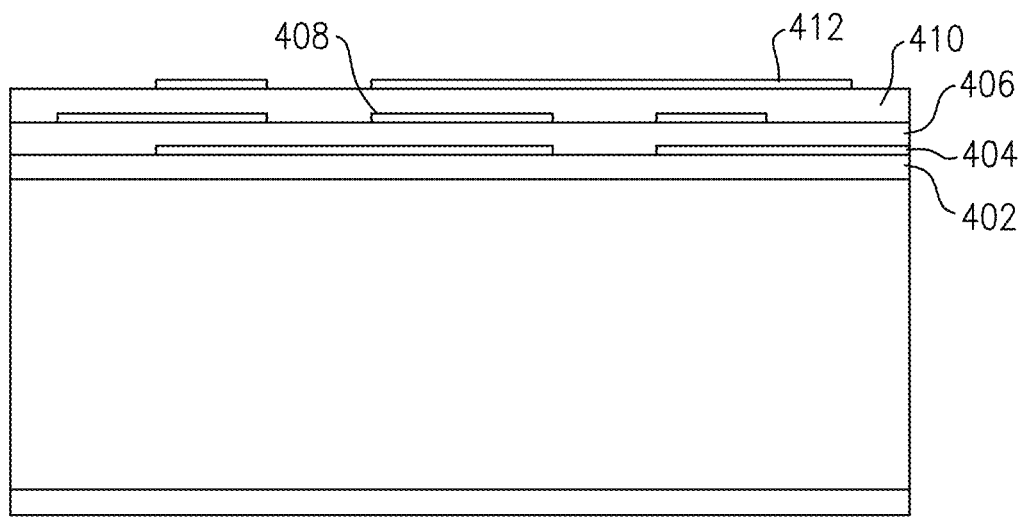
FIG. 12A is a cross-sectional side view of another step in the manufacture of a piezoelectric MEMS diaphragm microphone.
Figure 12B:
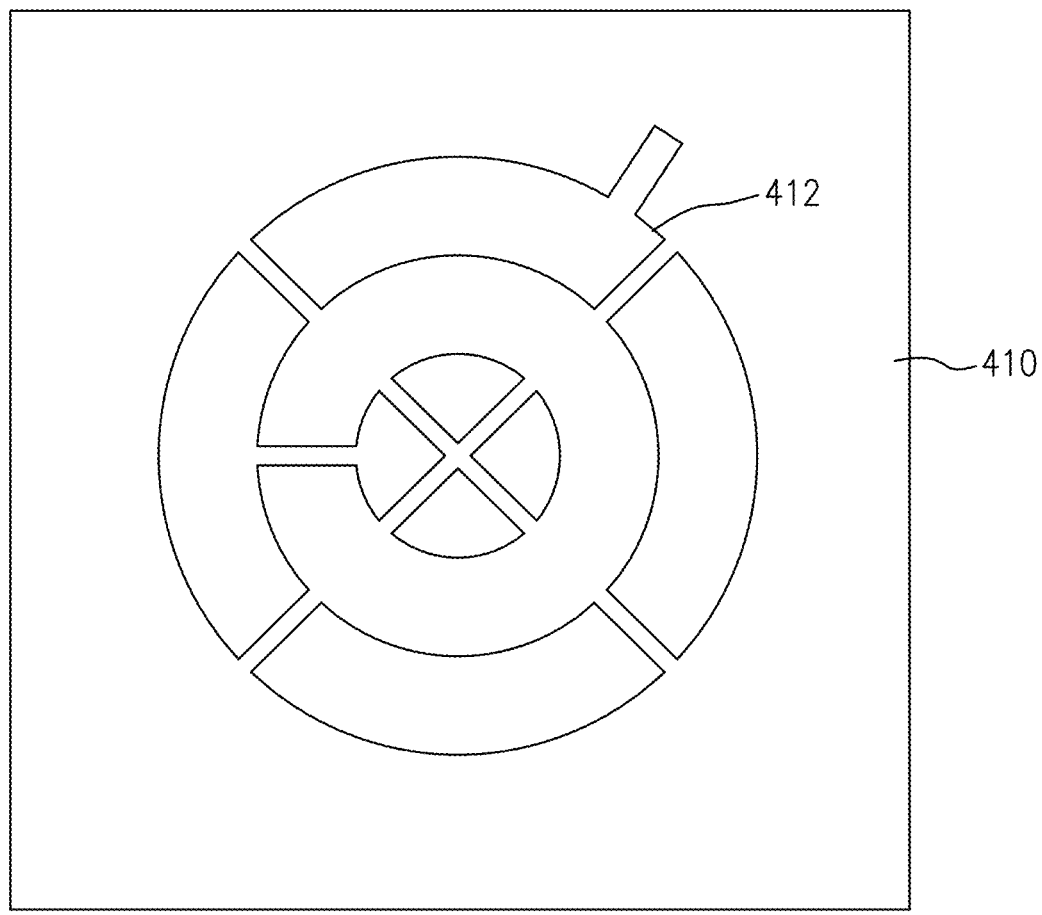
FIG. 12B is a top view of the structure in FIG. 12A.

FIGS. 12A-12B show a cross-sectional and a top view, respectively of the step of forming or applying 412 a third electrode (e.g., a "top" electrode) onto the one or more piezoelectric layers that are disposed on top of the second electrode. Optionally, the third electrode can be formed or applied 412 using a sputter machine and patterned by dry etching (e.g., using Reactive Ion Etch (ME) and/or Inductively Coupled Plasma (ICP) etch). In one implementation, the third electrode (e.g., third electrode 315, 315') optionally has a thickness of approximately 30 nm.

Figure 13A:
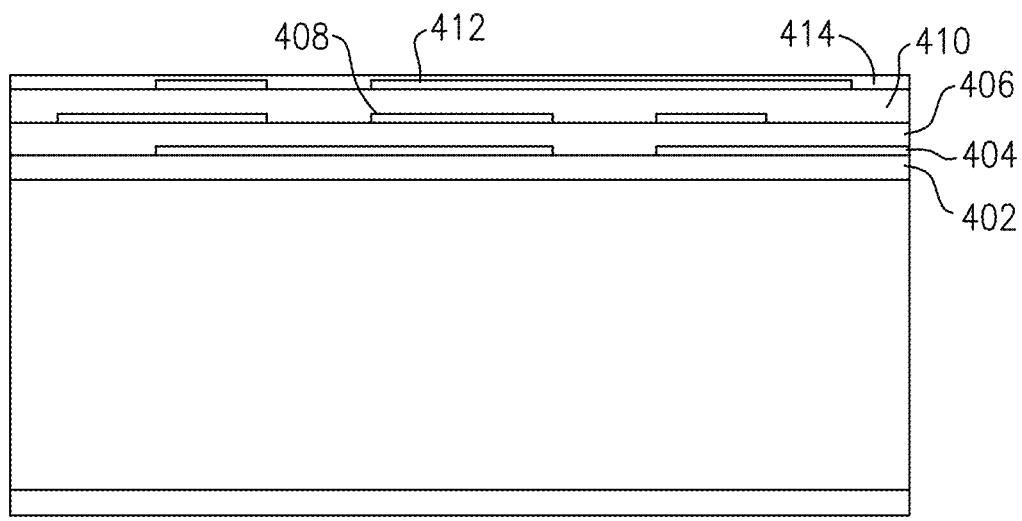
FIG. 13A is a cross-sectional side view of another step in the manufacture of a piezoelectric MEMS diaphragm microphone.
Figure 13B:
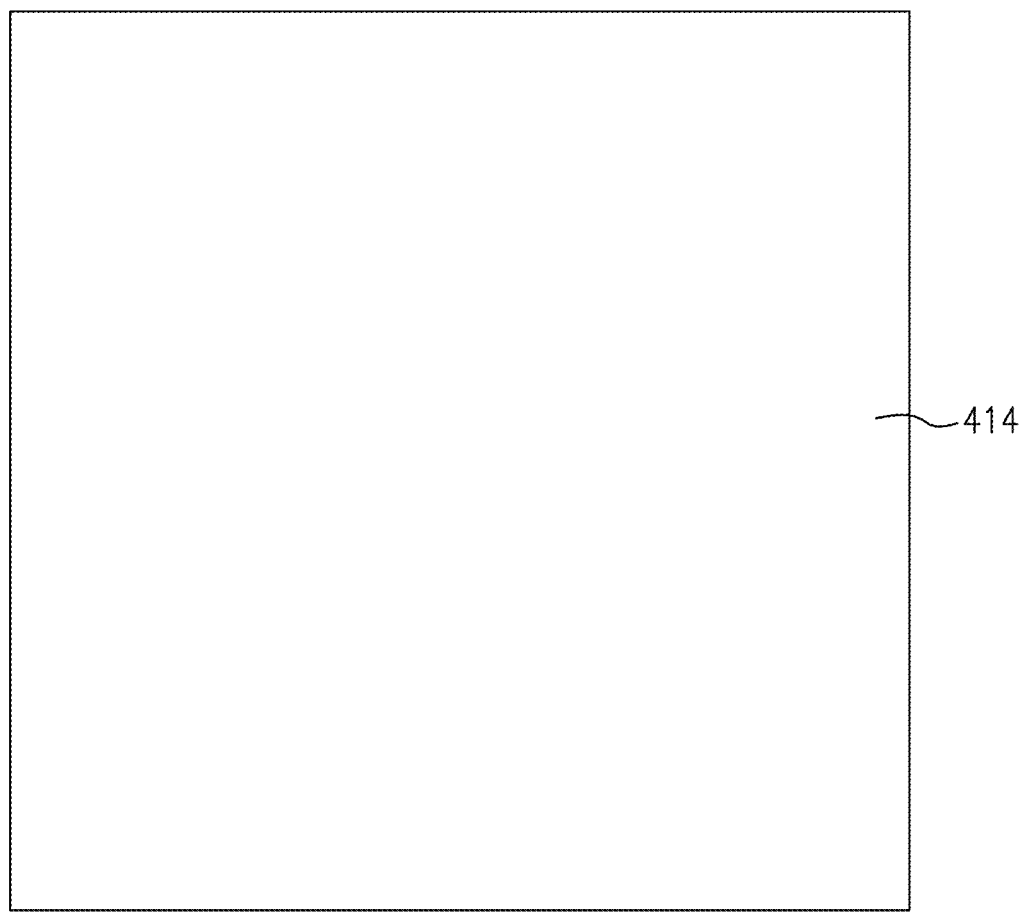
FIG. 13B is a top view of the structure in FIG. 13A.

FIGS. 13A-13B show a cross-sectional and a top view, respectively of the step of forming or applying 414 a passivation layer, such as the passivation layer 318, 318', on top of (e.g., adjacent to, attached to) the third electrode. Optionally, the passivation layer can be formed or applied 414 using a sputter machine or a Chemical Vapor Deposition (CVD) machine. In one implementation, the passivation layer optionally has a thickness of approximately 50 nm.

Figure 14A:
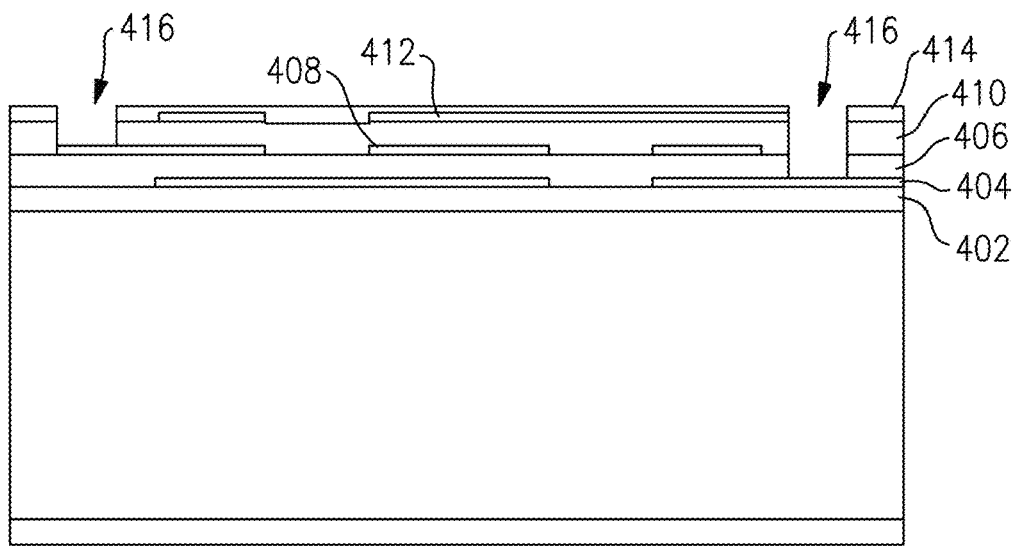
FIG. 14A is a cross-sectional side view of another step in the manufacture of a piezoelectric MEMS diaphragm microphone.
Figure 14B:
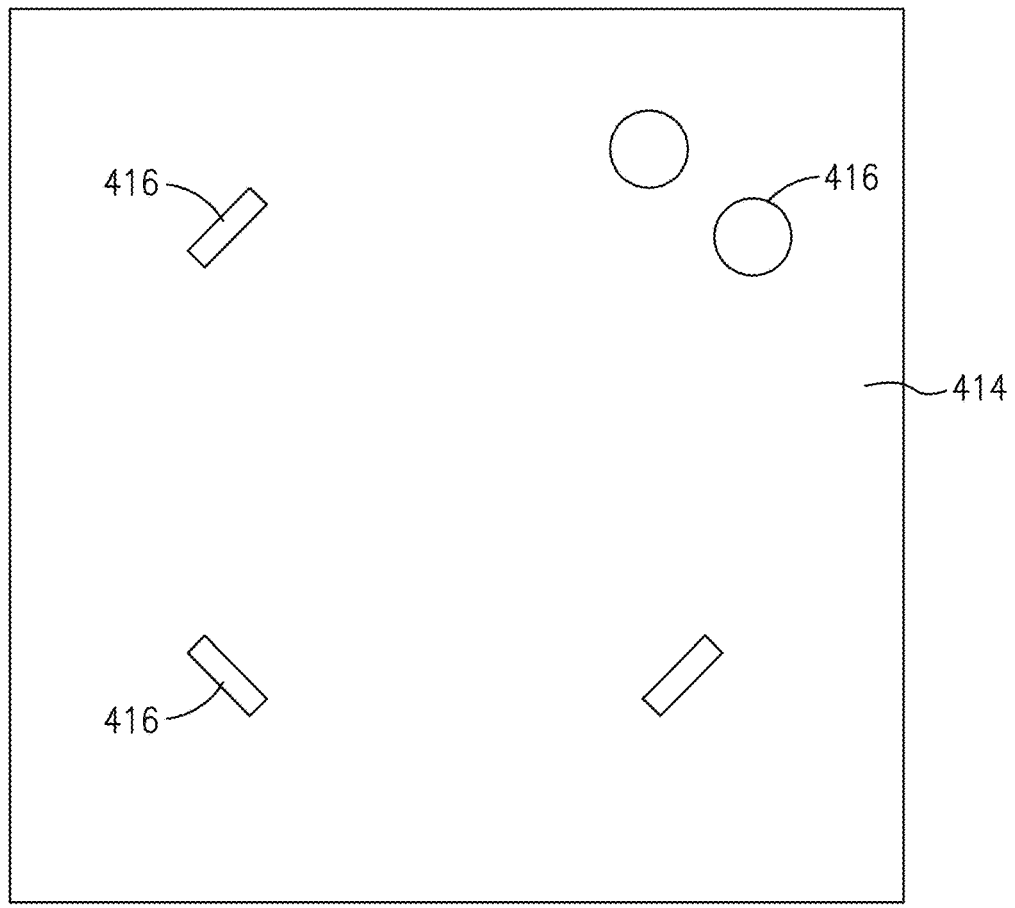
FIG. 14B is a top view of the structure in FIG. 14A.

FIGS. 14A-14B show a cross-sectional and a top view, respectively, of the step of forming (e.g., etching) 416 one or more vias through the passivation layer and one or more piezoelectric film layers. The figures show one via etched through one of (e.g., half of) the piezoelectric film layers and another via etched through two of (e.g., all of) the piezoelectric film layers. Optionally, the vias can be etched using an Inductively Coupled Plasma (ICP) etch machine and process.

Figure 15A:
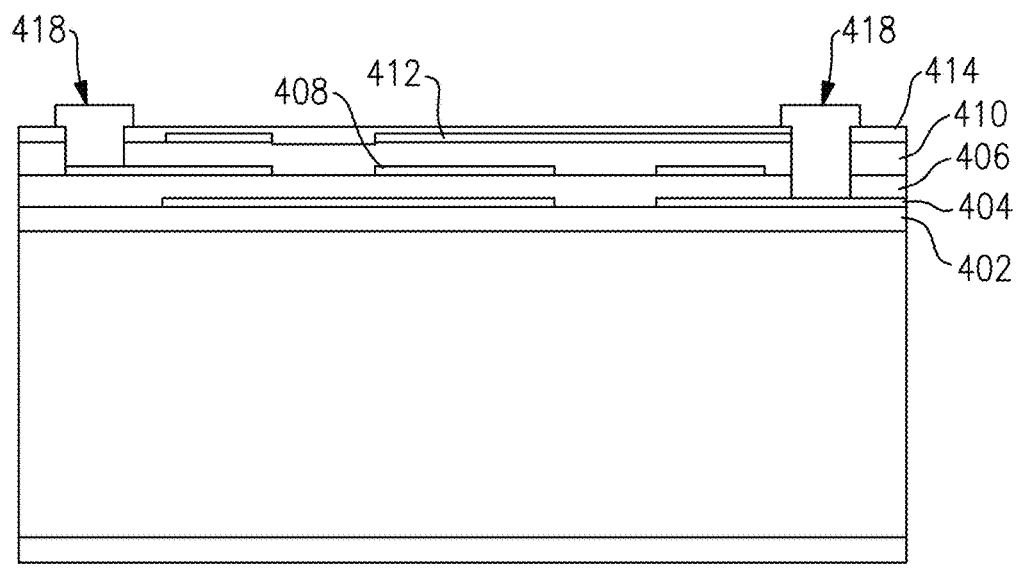
FIG. 15A is a cross-sectional side view of another step in the manufacture of a piezoelectric MEMS diaphragm microphone.
Figure 15B:
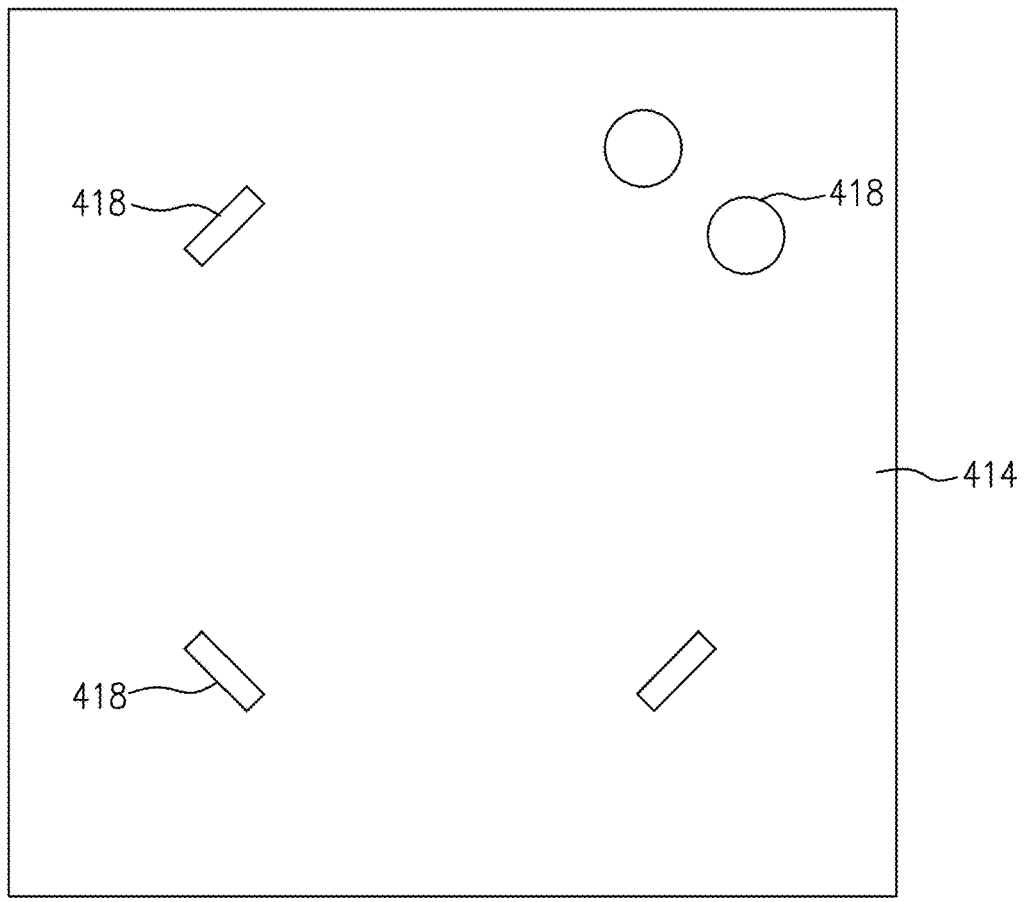
FIG. 15B is a top view of the structure in FIG. 15A.

FIGS. 15A-15B show a cross-sectional view and a top view, respectively, of the step of forming or applying 418 (e.g., via deposition) one or more bond pads, such as bond pads 316, 316', and patterning them. Optionally, the one or more bond pads can be formed or applied 418 using a sputter machine, or an E-beam evaporator and lift-off process. The passivation layer 318, 318' can serve to protect the top of the microphone 300A, 300B.

Figure 16A:
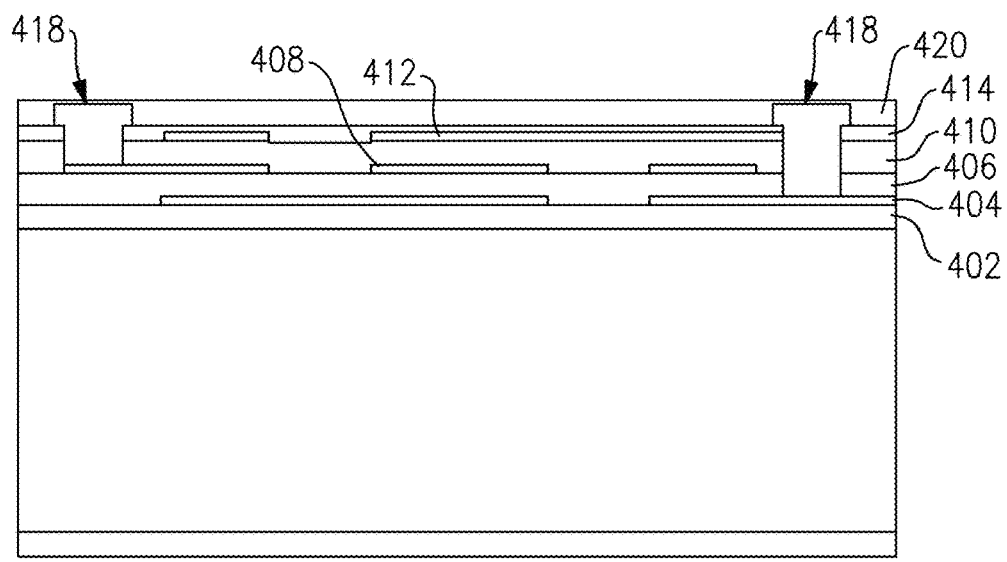
FIG. 16A is a cross-sectional side view of another step in the manufacture of a piezoelectric MEMS diaphragm microphone.
Figure 16B:
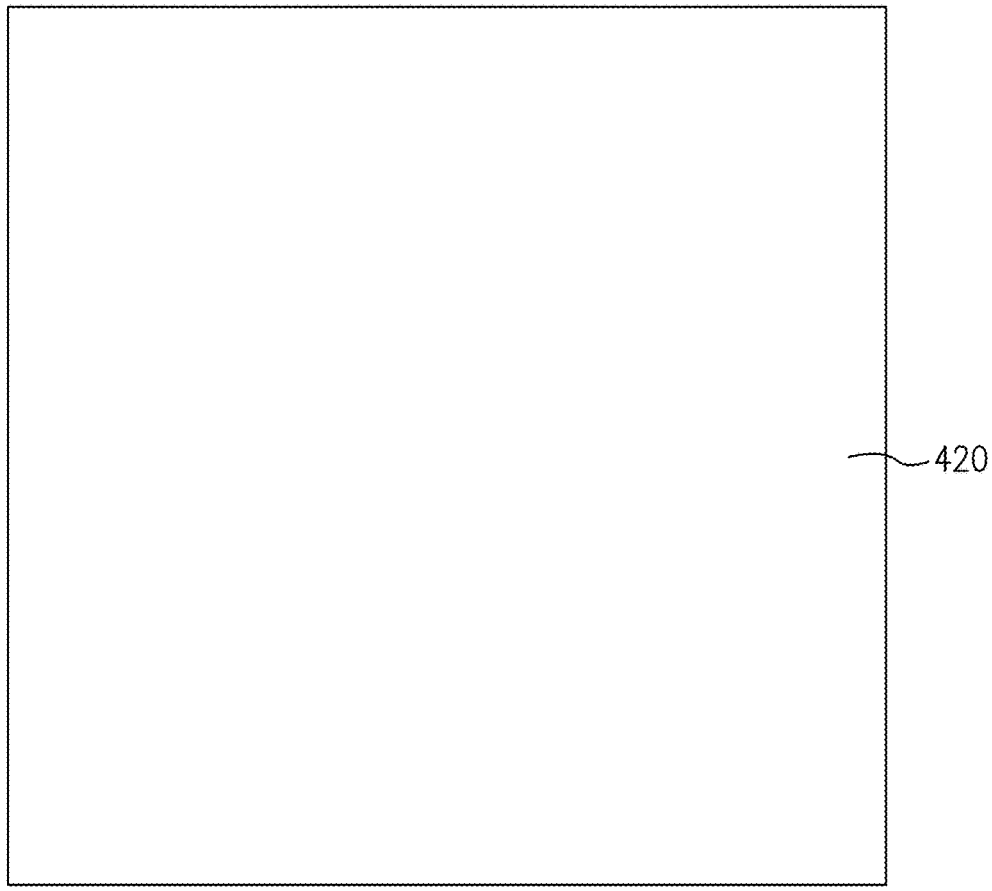
FIG. 16B is a top view of the structure in FIG. 16A.

FIGS. 16A-16B show a cross-sectional view and a top view, respectively, of the step of forming or applying 420 a top protection layer (e.g., a silicon dioxide layer) on top of (e.g., adjacent to, attached to) the passivation layer. Optionally, the top protection layer can be formed or applied 420 using a Plasma Enhanced Chemical Vapor Deposition (PECVD) machine and process. In one implementation, the top protection layer optionally has a thickness of approximately 2 µm.

Figure 17:
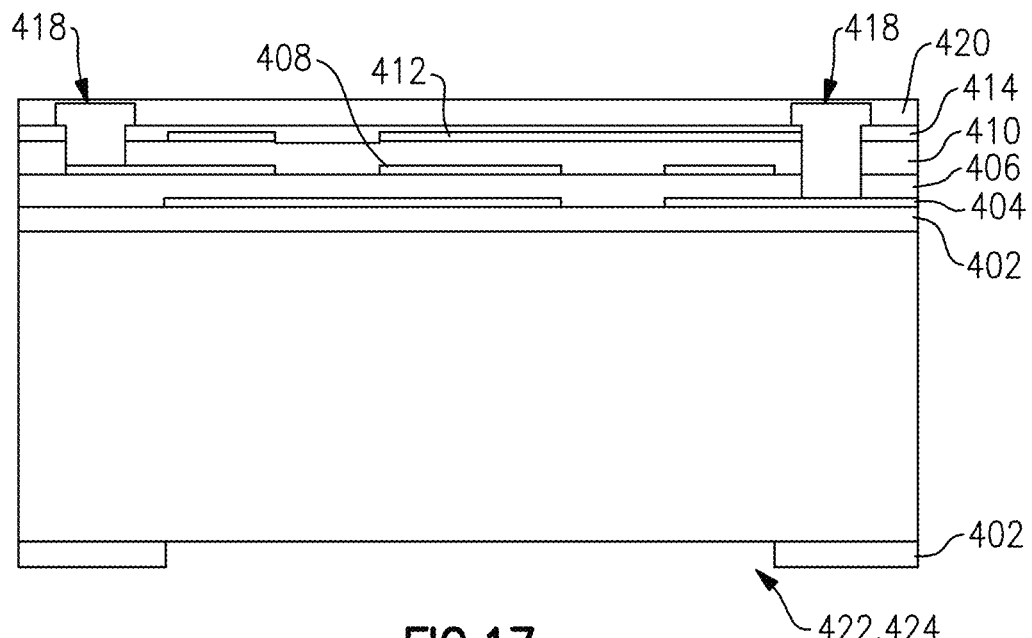
FIG. 17 is a cross-sectional side view of another step in the manufacture of a piezoelectric MEMS diaphragm microphone.

FIG. 17 shows a cross-sectional view of the step of patterning 422 and etching 424 the oxide layer on the bottom of the substrate. Optionally, the patterning and etching 422, 424 of the oxide layer on the bottom of the substrate can be performed using a Reactive Ion Etch (RIE) and/or Inductively Coupled Plasma (ICP) etch machine and process.

Figure 18:
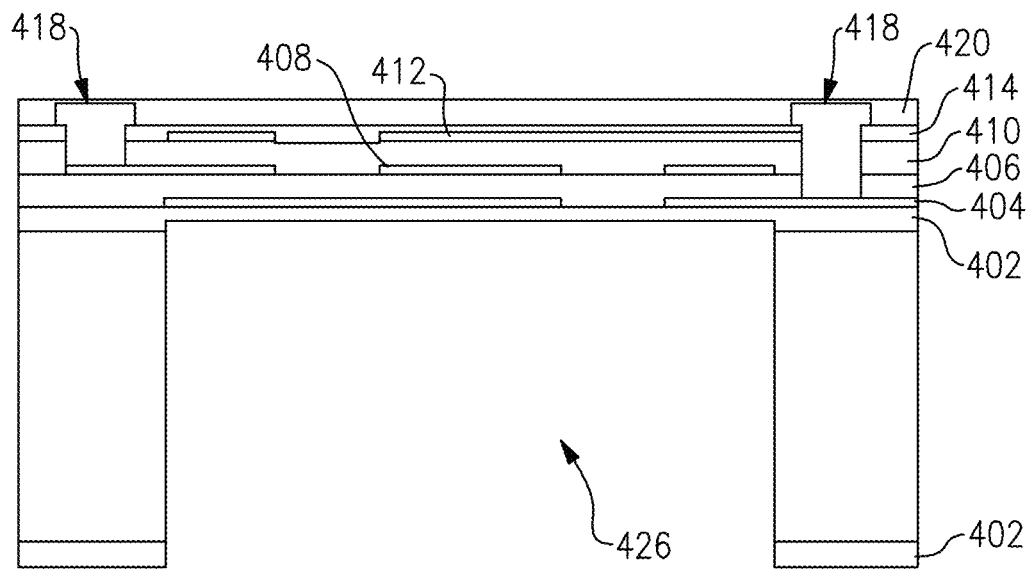
FIG. 18 is a cross-sectional side view of another step in the manufacture of a piezoelectric MEMS diaphragm microphone.

FIG. 18 shows a cross-sectional view of the step of etching 426 of the substrate to create an opening, such as the opening 320, 320', underneath the diaphragm. Optionally, the etching 426 of the substrate can be performed using a Deep Reactive Ion Etching (DRIE) machine and process.

Figure 19A:
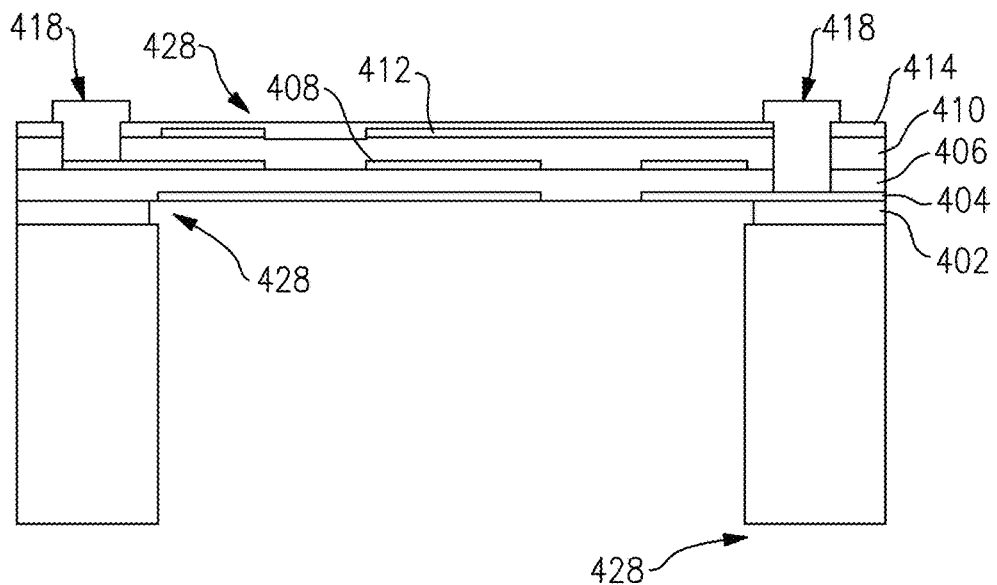
FIG. 19A is a cross-sectional side view of another step in the manufacture of a piezoelectric MEMS diaphragm microphone.
Figure 19B:
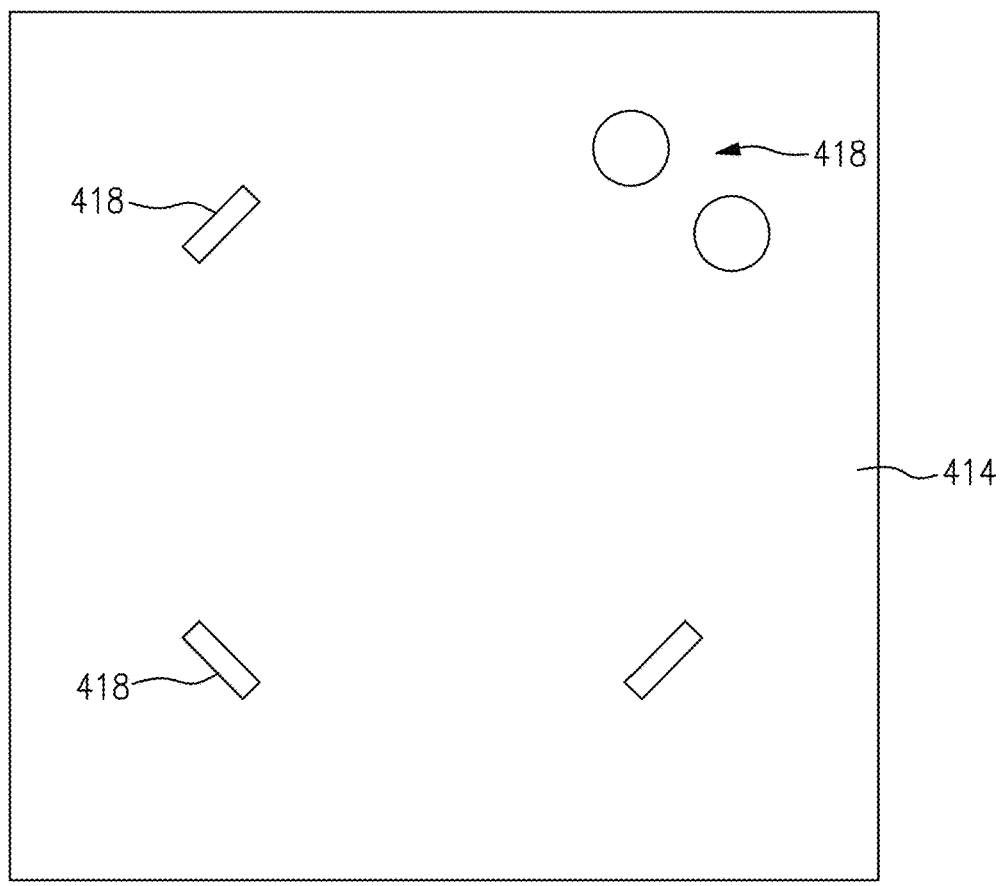
FIG. 19B is a top view of the structure in FIG. 19A.

FIGS. 19A and 19B show a cross-sectional view and a top view, respectively, of the step of removing 428 (e.g., etching) the protection layer, oxide layer on the bottom of the substrate, and oxide layer under the first electrode. Optionally, the removing (e.g., etching) 428 of the protection layer, oxide layer on the bottom of the substrate and oxide layer under the first electrode can be performed using a Vapor Hydrogen Fluoride (VHF) etch machine and process. The opening 320, 320' allows sound pressure to pass therethrough to exert a force on the diaphragm 319, 319' (e.g., on the first or bottom electrode 312, 312') to deflect the diaphragm 319, 319'.

In use, the microphone structure 300A, 300B is mounted on a printed circuit board (PCB) so that the opening 320, 320' is disposed over or otherwise generally aligned with an opening in the PCB through which sound pressure enters into the opening 320, 320' to deflect the diaphragm 319, 319' as discussed above.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the shielded inductor need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed shielded inductor.

What is claimed is:

1. A method of making a piezoelectric microelectromechanical systems diaphragm microphone, comprising:
   oxidizing a top surface and a bottom surface of a substrate to form a top oxidation layer and a bottom oxidation layer;
   forming or applying two or more piezoelectric film layers over the top surface of the substrate so that each of the two or more piezoelectric film layers have a predefined residual stress that substantially cancel each other out, the two or more piezoelectric film layers defining a substantially flat diaphragm structure with substantially zero residual stress;
   forming or applying one or more electrodes over the two or more piezoelectric film layers; and
   etching the bottom oxidation layer and substrate to form an opening in the substrate that allows sound pressure to travel through the opening to deflect the diaphragm structure.

2. The method of claim 1 wherein the diaphragm structure has a circular shape.

3. The method of claim 2 wherein forming or applying the one or more electrodes over the two or more piezoelectric film layers includes forming or applying a circumferential electrode over a circumference of the diaphragm structure and forming or applying a center electrode generally over a center of the diaphragm structure, at least a portion of the center electrode spaced apart from the circumferential electrode.

4. The method of claim 1 wherein the diaphragm structure has a rectangular shape.

5. The method of claim 4 wherein forming or applying the one or more electrodes over the two or more piezoelectric film layers includes forming or applying a plurality of side electrodes disposed adjacent corresponding side edges of the diaphragm structure, the plurality of side electrodes spaced apart from each other and disposed around an area of the diaphragm structure that extends between the plurality of side electrodes.

6. The method of claim 1 further comprising dividing the one or more electrodes into two or more electrode portions by forming one or more gaps between the electrode portions to provide a microphone with a desired sensitivity and capacitance.

7. The method of claim 6 further comprising connecting each pair of the two or more electrode portions in series with a connection via.

8. The method of claim 1 further comprising forming a through hole in the diaphragm structure from a top surface of the diaphragm structure to a bottom surface of the diaphragm structure to define a low frequency roll off for the microphone.

9. The method of claim 1 further comprising forming or applying a bottom electrode over the top surface of the substrate prior to forming or applying the two or more piezoelectric film layers.

10. The method of claim 9 further comprising forming or applying a middle electrode between two of the two or more piezoelectric film layers.

11. The method of claim 1 further comprising forming or applying a passivation layer over the one or more electrodes disposed over the two or more piezoelectric film layers.

12. The method of claim 1 wherein forming or applying two or more piezoelectric film layers over the top surface of the substrate so that each of the two or more piezoelectric film layers have a predefined residual stress that substantially cancel each other out includes controlling one or both of a pressure and a bias voltage during a deposition process for the each of the two or more piezoelectric film layers.

13. A method of making a radiofrequency module, comprising:
   forming or providing a printed circuit board that includes a substrate layer;
   forming or providing one or more piezoelectric microelectromechanical systems diaphragm microphones via a process comprising (a) oxidizing a top surface and a bottom surface of a substrate to form a top oxidation layer and a bottom oxidation layer, (b) forming or applying two or more piezoelectric film layers over the top surface of the substrate so that each of the two or more piezoelectric film layers have a predefined residual stress that substantially cancel each other out, the two or more piezoelectric film layers defining a substantially flat diaphragm structure with substantially zero residual stress, (c) forming or applying one or more electrodes over the two or more piezoelectric film layers, and (d) etching the bottom oxidation layer and substrate to form an opening in the substrate that allows sound pressure to travel through the opening to deflect the diaphragm structure; and
   mounting the one or more piezoelectric microelectromechanical systems diaphragm microphones on the printed circuit board.

14. The method of claim 13 wherein the diaphragm structure has a circular shape.

15. The method of claim 14 wherein forming or applying the one or more electrodes over the two or more piezoelectric film layers includes forming or applying a circumferential electrode over a circumference of the diaphragm structure and forming or applying a center electrode generally over a center of the diaphragm structure, at least a portion of the center electrode spaced apart from the circumferential electrode.

16. The method of claim 13 wherein the diaphragm structure has a rectangular shape.

17. The method of claim 16 wherein forming or applying the one or more electrodes over the two or more piezoelectric film layers includes forming or applying a plurality of side electrodes disposed adjacent corresponding side edges of the diaphragm structure, the plurality of side electrodes spaced apart from each other and disposed around an area of the diaphragm structure that extends between the plurality of side electrodes.

18. The method of claim 13 further comprising dividing the one or more electrodes into two or more electrode portions by forming one or more gaps between the electrode portions to provide a microphone with a desired sensitivity and capacitance.

19. The method of claim 18 further comprising connecting each pair of the two or more electrode portions in series with a connection via.

20. The method of claim 13 further comprising forming a through hole in the diaphragm structure from a top surface of the diaphragm structure to a bottom surface of the diaphragm structure to define a low frequency roll off for the microphone.

\* \* \* \* \*